United States Patent
Cho et al.

(10) Patent No.: US 11,803,264 B2
(45) Date of Patent: Oct. 31, 2023

(54) DISPLAY DEVICE INCLUDING A TOUCH MEMBER AND ANTISTATIC LINE

(71) Applicant: SAMSUNG DISPLAY CO., LTD., Yongin-si (KR)

(72) Inventors: Hyun Wook Cho, Yongin-si (KR); Min Hong Kim, Hwaseong-si (KR); Tae Joon Kim, Seongnam-si (KR); Jung Mok Park, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/403,847

(22) Filed: Aug. 16, 2021

(65) Prior Publication Data

US 2022/0057878 A1    Feb. 24, 2022

(30) Foreign Application Priority Data

Aug. 21, 2020  (KR) .......................... 10-2020-0105200

(51) Int. Cl.
*G06F 3/041*    (2006.01)
*G06F 3/044*    (2006.01)

(52) U.S. Cl.
CPC .......... *G06F 3/0412* (2013.01); *G06F 3/0416* (2013.01); *G06F 3/0446* (2019.05)

(58) Field of Classification Search
CPC ..... G06F 3/0412; G06F 3/0416; G06F 3/0446
See application file for complete search history.

(56) References Cited

U.S. PATENT DOCUMENTS

| | | | |
|---|---|---|---|
| 2014/0028582 A1* | 1/2014 | Choi | G06F 3/0443 345/173 |
| 2018/0018029 A1* | 1/2018 | Lim | G06F 3/0383 |
| 2020/0033967 A1* | 1/2020 | Yang | G06F 3/0443 |
| 2020/0168689 A1* | 5/2020 | Park | H01L 27/3276 |
| 2021/0176903 A1* | 6/2021 | Tian | G06F 3/0443 |
| 2021/0202637 A1* | 7/2021 | Kim | H10K 59/40 |
| 2021/0232266 A1* | 7/2021 | Wu | H01L 51/0097 |
| 2021/0318788 A1 | 10/2021 | Cho et al. | |
| 2022/0075483 A1* | 3/2022 | Yan | G06F 3/0446 |

FOREIGN PATENT DOCUMENTS

KR   10-2018-0007388    1/2018
KR   10-2021-0127295    10/2021

* cited by examiner

*Primary Examiner* — Liliana Cerullo
(74) *Attorney, Agent, or Firm* — F. CHAU & ASSOCIATES, LLC

(57) ABSTRACT

A display is provided. A display panel including a first substrate, a second substrate an active element layer disposed on the first substrate, and a sealing member coupling the first substrate and the second substrate, and a touch member disposed on the display panel and including a touch signal line and a touch antistatic line, wherein the touch antistatic line is disposed outside the touch signal line and at least partially overlaps the sealing member, and the touch antistatic line has light transmittance higher than light transmittance of the touch signal line.

20 Claims, 19 Drawing Sheets

US 11,803,264 B2

DISPLAY DEVICE INCLUDING A TOUCH MEMBER AND ANTISTATIC LINE

CROSS REFERENCE TO RELATED APPLICATION

This application claims priority under 35 U.S.C. § 119 to Korean Patent Application No. 10-2020-0105200 filed on Aug. 21, 2020 in the Korean intellectual Property Office, the disclosure of which is incorporated by reference herein in its entirety.

TECHNICAL FIELD

The present disclosure relates to a display device, and more particularly, to a display device including a touch member.

DISCUSSION OF THE RELATED ART

Display devices are used in various electronic appliances to display images to a user. These appliances include smart phones, tablet PCs, digital cameras, notebook computers, navigators, and televisions. A display device includes a display panel that generates and displays an image, as well as various input devices.

Recently, a touch panel recognizing a touch input has been widely applied to display devices in the fields of smart phones and tablet PCs. The touch panel determines whether there is an input, and calculates the corresponding position as a touch input coordinate. The touch panel may include a plurality of touch sensing lines, touch driving lines, guard lines, and antistatic lines.

SUMMARY

Aspects of the present disclosure are to provide a display device capable of securing an area in which touch signal lines are arranged without interfering with the curing of a sealing member that seals between a support substrate and an encapsulation substrate of a display panel.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

An embodiment of a display device includes a display panel including a first substrate, a second substrate, an active element layer disposed on the first substrate, and a sealing member coupling the first substrate and the second substrate, and a touch member disposed an the display panel and including a touch signal line and a touch antistatic line, wherein the touch antistatic line is disposed outside the touch signal line and at least partially overlaps the sealing member, and the touch antistatic line has light transmittance higher than light transmittance of the touch signal line.

An embodiment of a display device includes a display panel including a first substrate, a second substrate, an active element layer disposed on the first substrate, and a sealing member coupling the first substrate and the second substrate, and a touch member disposed on the display panel and including a touch signal line and a touch antistatic line, wherein the touch member includes: a first touch conductive layer including a touch signal line, a first touch insulating layer disposed on the first touch conductive layer, and a second touch conductive layer disposed on the first touch insulating layer and including a touch antistatic line, wherein the touch antistatic line is disposed outside the touch signal line, and at least partially overlaps the sealing member of the display panel.

An embodiment of a display device includes a display panel including a first substrate, a second substrate, an active element layer disposed on the first substrate, and a sealing member coupling the first substrate and the second substrate, and a touch member including a plurality of touch lines, wherein the outermost touch line of the plurality of touch lines include a transparent conductive layer, and at least partially overlaps the sealing member.

A display device according to an embodiment, an area in which touch signal lines are arranged can be secured without interfering with the curing of a sealing member that seals between a support substrate and an encapsulation substrate of a display panel.

The aspects of the present disclosure are not limited by the foregoing, and other various effects are anticipated herein.

BRIEF DESCRIPTION OF THE DRAWINGS

The above and other aspects and features of the present disclosure will become more apparent by describing in detail exemplary embodiments thereof with reference to the accompanying drawings, in which.

DETAILED DESCRIPTION OF THE EMBODIMENTS

The present inventive concepts will now be described more fully hereinafter with reference to the accompanying drawings, in which embodiments of the inventive concepts are shown. The inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art.

It will also be understood that when a layer is referred to as being "on" another layer or substrate, it can be directly on the other layer or substrate, or intervening layers may also be present. The same reference numbers may indicate like components throughout the specification. In the attached figures, the thickness of layers and regions may be exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element might not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Hereinafter, embodiments of the present inventive concepts will be described with reference to the attached drawings.

Figure 1:
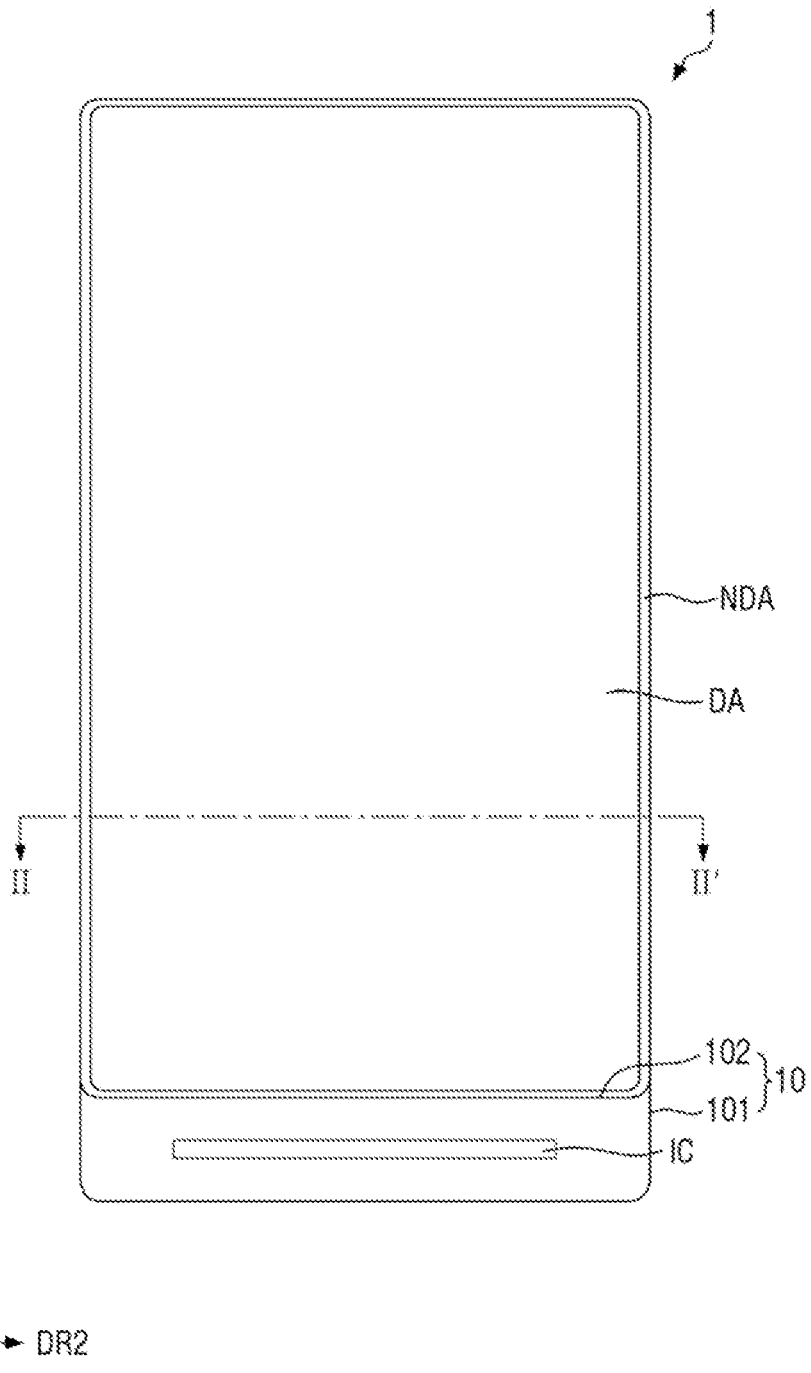
FIG. 1 is a plan view of a display device according to an embodiment.
Figure 2:
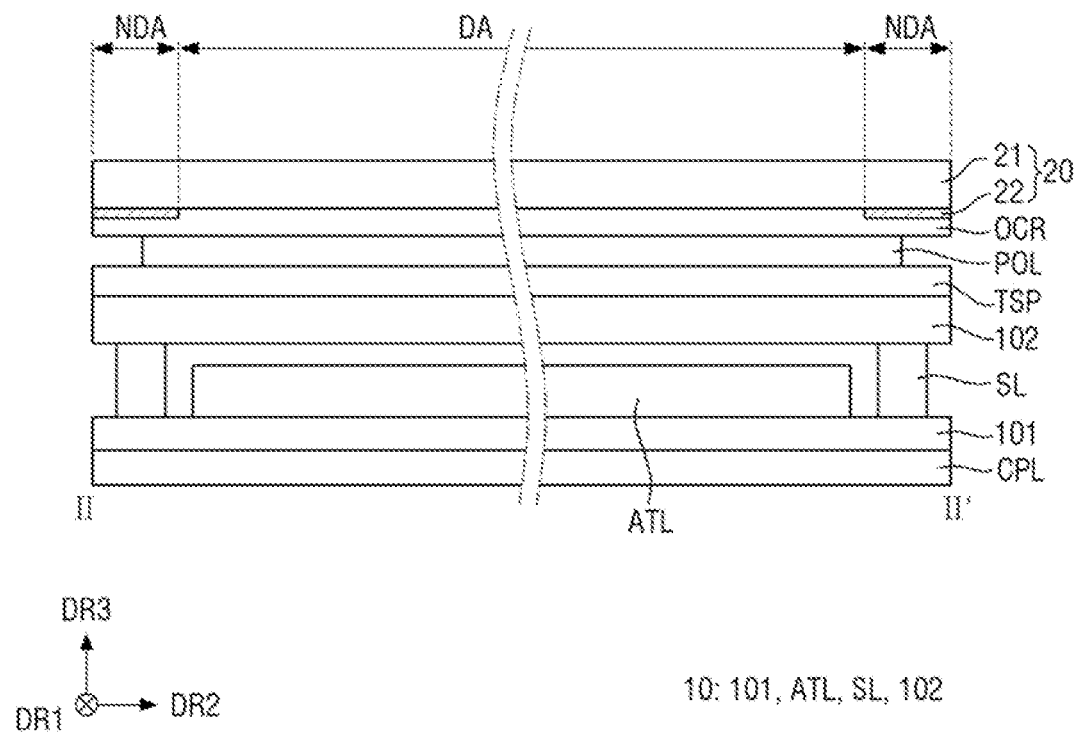
FIG. 2 is a schematic cross-sectional view taken along the line II-II' of FIG. 1.

FIG. 1 is a plan view of a display device according to an embodiment. FIG. 2 is a schematic cross-sectional view taken along the line II-II' of FIG. 1. FIG. 2 schematically illustrated a cross-sectional view of a display device according to an embodiment.

Referring to FIGS. 1 and 2, the first direction DR1 and the second direction DR2 are directions that intersect each other in different directions, for example, directions that intersect each other within a plane. The third direction DR3 is a direction that intersects the plane on which the first direction DR1 and the second directions DR2 are placed, for example, a direction that vertically intersects both the first direction DR1 and the second directions DR2. With reference to the attached drawings, the first direction DR1 indicates a vertical direction of the display device 1, the second direction DR2 indicates a horizontal direction of the display device 1, and the third direction DR3 indicates a thickness direction of the display device 1.

Unless otherwise defined, as used herein, "upper portion", "upper surface", and "upper side" are expressed based on the third direction DR3 and refer to a side of a display surface based on the display panel 10, and "lower portion", "lower surface", and "lower side" are expressed based on the third direction DR3 and refer to an opposite side of a display surface based on the display panel 10. However, the directions mentioned in embodiments should be understood as conveying relative directions, and the embodiments are not necessarily limited to the these directions.

The display device 1 displays a moving image or a still image. A main screen of the display device 1 may display on one side of the third direction DR3 (for example, a front emission type display device), but the present disclosure is not necessarily limited thereto.

The display device 1 may refer to any electronic device that provides a display screen. For example, the display device 1 may be applied to televisions, notebook computer, monitors, billboards, mobile phones, smart phones, tablet personal computers (PCs), electronic clocks, smart watches, watch phones, mobile communication terminals, electronic notebooks, e-books, portable multimedia players (PMPs), navigators, game machines, digital cameras, and internet of things (IoTs) devices, each providing a display screen.

The display device 1 may include a display area DA and a non-display area NDA. The display area DA may be defined as an area where an image is displayed, and the non-display area NDA may be defined as an area where an image is not displayed. When the display device 1 has a touch function, the touch area TA (refer to FIG. 3), which is an area where a touch input is sensed, may overlap the display area DA.

Figure 3:
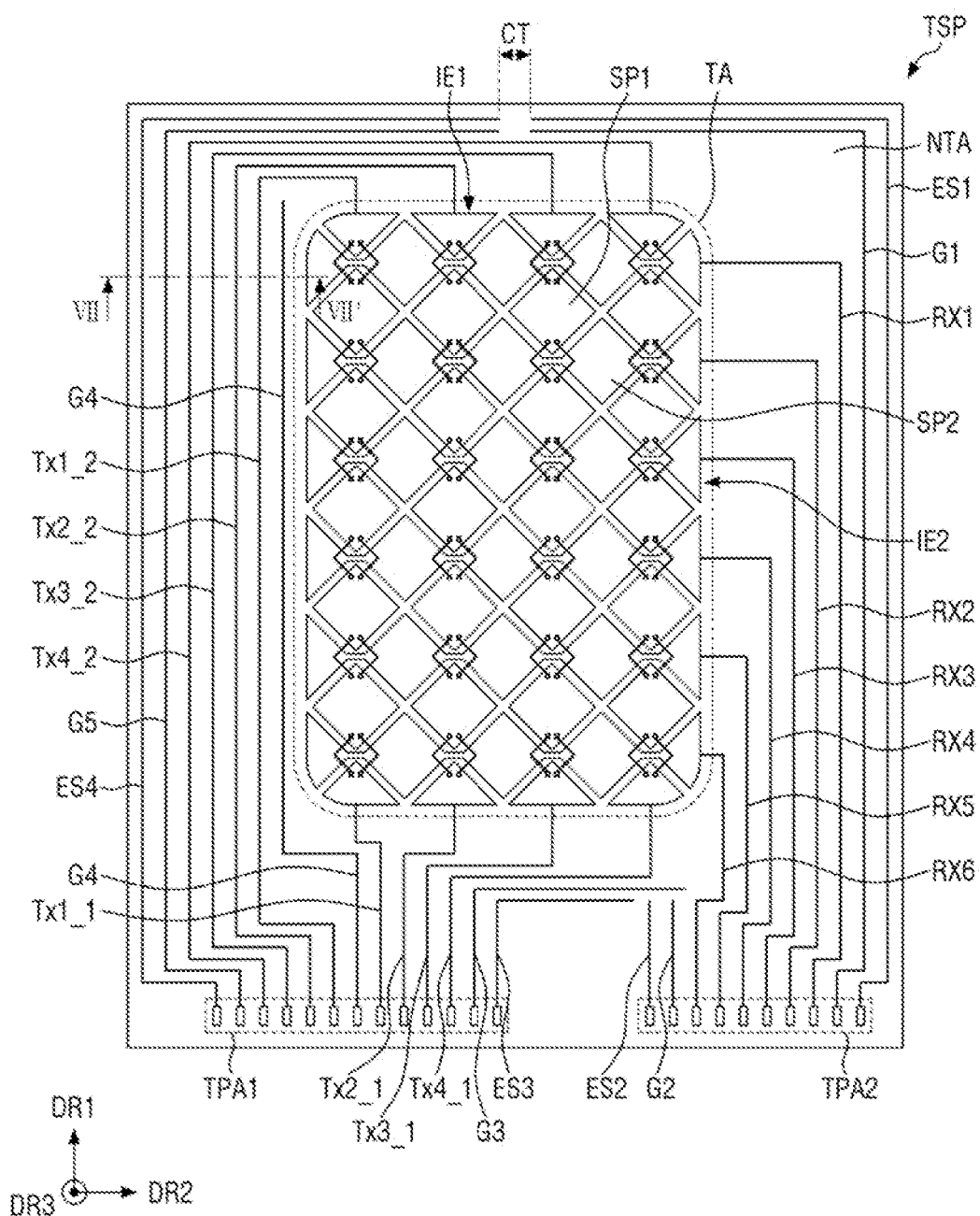
FIG. 3 is a schematic plan layout view of a touch member according to an embodiment.

The display area DA may include a plurality of pixels ("PX" of FIG. 3). Details thereof will be described later.

The non-display area NDA may be disposed around the display area DA. The non-display area NDA may be a bezel area. The non-display area NDA may overlap a printing layer (refer to "22" in FIG. 2) of a window member (refer to "20" in FIG. 2) to be described later.

The non-display area NDA may at least partially surround a perimeter (including four sides in the drawings) of the display area DA. However, the present disclosure is not necessarily limited thereto, and for example, the non-display area NDA might not be disposed near the upper side of the display area DA.

The non-display area NDA may be provided with signal lines or driving circuits for applying signals to the display area DA (and/or the touch area TA (refer to FIG. 3)). In an embodiment, a driving chip IC may be disposed in the non-display area NDA. The driving chip IC may include an integrated circuit that drives the display panel 10 and/or the touch member (TSP, refer to FIG. 2). The integrated circuit may include an integrated circuit for a display and/or an integrated circuit for a touch member ("TSP" in FIG. 2). The driving chip IC may be directly mounted on a protrusion area of the first substrate 101 protruding from the second substrate 102.

FIG. 2 is a cross-sectional view taken along line II-II' in FIG. 1. Hereinafter, a cross-sectional structure of the display device 1 will be described with reference to FIGS. 1 and 2.

The display device 1 includes a display panel 10 providing a display screen, a touch member TSP, an anti-reflection member POL, a window member 20, and a cover panel CPL disposed under the display panel 10.

The display panel 10 may be an organic light emitting display panel, a micro LED display panel, a nano LED display panel, a quantum dot light emitting display panel, a liquid crystal display panel, a plasma display panel, an electric field emission display panel, an electrophoretic display panel, an electrowetting display panel, or the like. Hereinafter, as an example of the display panel 10, an organic light-emitting display panel is applied, but the present disclosure is not necessarily limited thereto, and other display panels may be applied as long as the same technical idea is applicable.

The display panel 10 may include a first substrate 101, a second substrate 102, an active element layer ATL, and a sealing member SL.

The first substrate 101 may support the active element layer ATL located thereon. The first substrate 101 is substantially transparent, and may have high light transmittance. The first substrate 101 may include, but is not necessarily limited to, an inorganic material such as glass and/or quartz. The inorganic material may include, but is not necessarily limited to, silicon oxide ($SiO_2$). However, the present disclosure is not necessarily limited thereto, and the first substrate 101 may be a transparent plate or a transparent film.

The second substrate 102 may face the first substrate 101 and be spaced apart from the first substrate 101. The second substrate 102 may protect the active element layer ATL from external moisture and air. The second substrate 102 is substantially transparent, and may have high light transmittance. The second substrate 102 may include, but is not necessarily limited to, an inorganic material such as glass and/or quartz. The inorganic material may include, but is not necessarily limited to, silicon oxide ($SiO_2$). However, the present disclosure is not necessarily limited thereto, and the second substrate 102 may be a transparent plate or a transparent film.

The active element layer ATL may be disposed between the first substrate 101 and the second substrate 102. The active element layer ATL may be disposed on the upper surface (or one surface) of the first substrate 101. The active element layer ATL may include a light emitting element and a thin film transistor driving the light emitting element. The second substrate 102 may be disposed over the active element layer ATL, though the present disclosure is not necessarily limited thereto. Details of the active element layer ATL will be described later.

The sealing member SL may be disposed between the first substrate 101 and the second substrate 102. For example, the sealing member SL may be disposed in the non-display area NDA of the display device 1 to at least partially surround the display area DA. The sealing member SL may couple the first substrate 101 and the second substrate 102 to each other, and may encapsulate the active element layer ATL together with the first substrate 101 and the second substrate 102. In an embodiment, the sealing member SL may include a frit, but the present disclosure is not necessarily limited thereto.

An inner region of the display panel 10, the inner region being a region within the first substrate 101, the second substrate 102, and the sealing member SL, may be provided between the first substrate 101 and the second substrate 102. The inner region may be in a vacuum state or may be filled with gas. The gas may include, but is not necessarily limited to, an inert gas or a general atmosphere. A filter material may be used in addition to the gas.

The touch member TSP may be disposed on the display panel 10. The touch member TSP may sense a touch input. The touch member TSP may include a plurality of sensing areas and a plurality of sensing electrodes. The touch member TSP may be disposed on the upper surface (or one surface) of the second substrate 102. As illustrated in the following embodiments, the touch member TSP may be provided in the form of a touch layer integrated with the display panel 10, but the present disclosure is not necessarily limited thereto, and the touch member TSP may be placed on the display panel 10 in the form of a touch panel or a touch film. Details of the touch member TSP will be described later.

The anti-reflection member POL may be disposed on the touch member TSP. The anti-reflection member POL may be attached in the form of a polarizing film. The anti-reflection member POL may polarize transmitted light. The anti-reflection member POL may serve to reduce the reflection of external light. However, the present disclosure is not necessarily limited thereto, and the anti-reflection member POL may be stacked in the form of an anti-reflection layer inside the display panel 10. In this case, the anti-reflection member POL may include a color filter or the like that selectively transmits light of a specific wavelength. Further, when the touch member TSP is omitted, the anti-reflection member POL may be attached onto the second substrate 102.

The window member 20 is disposed on the anti-reflection member POL. The window member 20 serves to cover and protect the display panel 10. The window member 20 may include a window substrate 21 and a printing layer 22 disposed on the window substrate 21. The window member 20 is attached onto one surface of the display panel 10 through a transparent bonding layer including an optical clear adhesive (OCA) or an optical clear resin (OCR). When the display device 1 includes the anti-reflection member POL, the window member 20 may be attached onto the upper surface (or one surface) of the anti-reflection member POL.

The window substrate 21 may be made of a transparent material. The window substrate 21 may include, for example, glass or plastic.

The planar shape of the window substrate 21 may correspond to the shape of the applied display device 1. For example, when the display device 1 has a substantially rectangular shape on a plan view, the window substrate 21 may also have a substantially rectangular shape. As another example, when the display device 1 has a circular shape, the window substrate 21 may also have a circular shape.

The printing layer 22 may be disposed on the window substrate 21. The printing layer 22 may be disposed on one surface and/or the other surface of the window substrate 21. The printing layer 22 is disposed on the edge of the window substrate 21, and may be disposed in the non-display area NDA. The printing layer 22 may be a light-blocking layer or a decorative layer that imparts aesthetics.

Hereinafter, a touch member TSP according to an embodiment will be described.

FIG. 3 is a schematic plan layout view of a touch member according to an embodiment.

Referring to FIG. 3, the touch member TSP includes a touch area TA that is an active area and a non-touch area NTA that is an inactive area. The touch area TA may overlap the above-described display area DA (refer to FIG. 1), and the non-touch area NTA may overlap the above-described non-display portion NDA (refer to FIG. 1). Although it is shown in FIG. 3 that the overall shape of the touch member TSP is simplified and the non-touch area NTA is relatively wide, this is done for convenience of explanation, and the shape of the touch area TA and the shape of the non-touch area NTA may be substantially the same as the shape of the display area DA and the shape of the non-display area NDA, respectively.

The touch area TA of the touch member TSP may include a plurality of first sensing electrodes IE1 (or first touch electrodes) and a plurality of second sensing electrodes IE2 (or second touch electrodes). Any one of the first sensing electrode IE1 and the second sensing electrode IE2 may be configured as a driving electrode, and the other may be configured as a sensing electrode. In the present example, the first sensing electrode IE1 is configured as a driving electrode and the second sensing electrode IE2 is configured as a sensing electrode.

Figure 4:
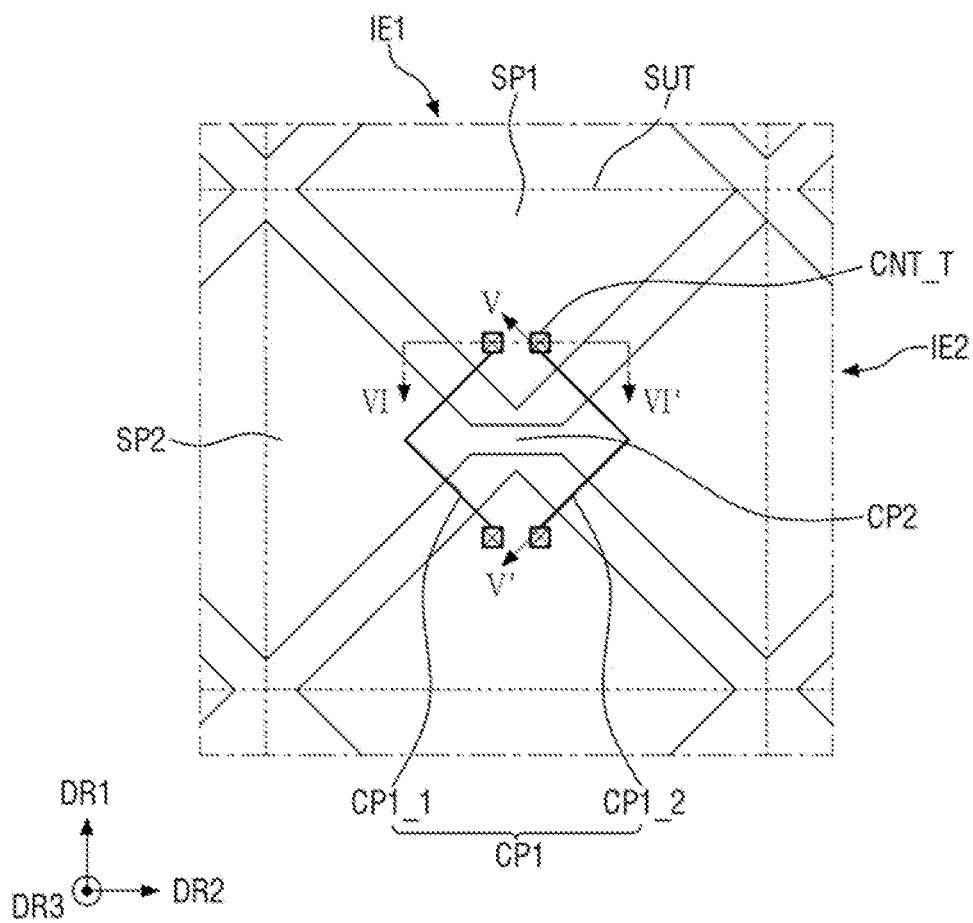
FIG. 4 is a partially enlarged view of the touch area of FIG. 3.

The first sensing electrode IE1 may extend in the first direction DR1. Referring to FIGS. 3 and 4, he first sensing electrode IE1 may include a plurality of first sensor units SP1 arranged along the first direction DR1 and a first connection unit CP1 electrically connecting the adjacent first sensor units SP1. The plurality of first sensing electrodes IE1 may be arranged in columns spanning the second direction DR2.

The second sensing electrode IE2 may extend in the second direction DR2. The second sensing electrode IE2 may include a plurality of second sensor units SP2 arranged in the second direction DR2 and a second connection unit CP2 electrically connecting the adjacent second sensor units SP2. The plurality of second sensing electrodes IE2 may be arranged in rows spanning the first direction DR1.

Although the drawings illustrate a case where four columns of first sensing electrodes IE1 and six rows of second sensing electrodes IE2 are arranged, it is understood that the number of the first sensing electrodes IE1 and the number of the second sensing electrodes IE2 are not necessarily limited thereto. The touch area TA will be described in more detail with reference to FIG. 4.

FIG. 4 is a partially enlarged view of the touch area of FIG. 3.

Referring to FIGS. 3 and 4, at least some of the first sensor units SP1 and the second sensor units SP2 may have a rhombus shape. Some of the first sensor unit SP1 and the second sensor unit SP2 may have a shape cut from a rhombus shape. For example, the first sensor units SP1 and the second sensor units SP2 except for both ends in the extension direction may have a rhombus shape, and the first sensor units SP1 and the second sensor units SP2 located at both ends in the extension direction may shape of a rhombus is cut in half, for example, a triangular shape. The first sensor units SP1 having a rhombus shape and the second sensor units SP2 having a rhombus shape may be substantially the same as each other in size and shape. Additionally, the first sensor units SP1 having a triangular shape and the second sensor units SP2 having a triangular shape may be substantially the same as each other in size and shape. However, the present disclosure is not necessarily limited thereto, and the shapes and sizes of the first sensor units SP1 and the second sensor units SP2 may be variously modified.

The first connection unit CP1 may connect the corners of the rhombus or triangle of the adjacent first sensor units SP1. The second connection unit CP2 may connect the corners of the rhombus or triangle of the adjacent second sensor units SP2. The widths of the first connection unit CP1 and the second connection unit CP2 may be smaller than the widths of the first sensor unit SP1 and the second sensor unit SP2, respectively.

The first sensing electrode IE1 and the second sensing electrode IE2 may be insulated from each other and intersect each other. Insulation between the first sensing electrode IE1 and the second sensing electrode IE2 may be secured by disposing the first sensing electrodes IE1 and second sensing electrodes IE2 on a conductive layer such that another layer spaces the sensing electrodes apart in areas where the sensing electrodes cross each other. The first connection unit CP1 and/or the second connection unit CP2 may be formed at the intersections of the first sensing electrode IE1 and the second sensing electrode IE2. To provide insulation, at least one of the first connection unit CP1 and the second connection unit CP2 may be located on a different layer from the first detection electrode IE1 and the second detection electrode IE2.

For example, the first sensor unit SP1 of the first sensing electrode IE1 and the second sensor unit SP2 of the second sensing electrode IE2 may be formed from the same conductive layer, and the first sensor unit SP1 itself and the second sensor unit SP2 itself might not intersect or overlap each other. The adjacent first sensor unit SP1 and second sensor unit SP2 may be physically spaced apart from each other.

The second connection unit CP2 may be formed from the same conductive layer as the second sensor unit SP2 to connect the adjacent second sensor units SP2. The first sensor units SP1 adjacent to the first sensing electrode IE1 are physically spaced apart by an area through which the second connection unit CP2 passes. The first connection unit CP1 connecting the first sensor units SP1 may be formed of a different conductive layer from the first sensor unit SP1 to traverse the area of the second sensing electrode IE2. The first connection unit CP1 may be electrically connected to each of the adjacent first sensor units SP1 through a contact.

A plurality of first connection units CP1 may be provided. For example, although not necessarily limited thereto, the first connection unit CP1 may include one first connection unit CP1_1 overlapping and passing one adjacent second sensing electrode IE2 and the other first connection unit CP1_2 overlapping and passing the other adjacent second sensing electrode IE2. When a plurality of first connection units CP1 connecting two adjacent first sensor units SP1 are provided, even if one of the first connection units CP1 is disconnected due to static electricity or the like, disconnection of the corresponding first sensing electrode IE1 may be prevented.

The first sensor units SP1 and the second sensor units SP2, adjacent to each other, may constitute a unit sensing area SUT. For example, with respect to the area where the first sensing electrode IE1 and the second sensing electrode IE2 intersect each other, half of the adjacent two first sensor units SP1 and half of the adjacent two second sensor units SP2 may form one square or rectangle. As such, the area defined by half of the adjacent two first sensor units SP1 and half of the adjacent two second sensor units SP2 may be one unit sensing area SUT. The plurality of unit sensing areas SUT may be arranged in a matrix formation.

In each unit sensing area SUT, a capacitance value may be measured between the first sensor unit SP1 and adjacent second sensor unit SP2, thereby determining whether or not there is a touch input and calculating the corresponding position as touch input coordinates. Touch sensing may be performed by a mutual cap method, but the present disclosure is not necessarily limited thereto.

Each unit sensing area SUT may be larger than a pixel in size. For example, the unit sensing area SUT may correspond to a plurality of pixels. The length of one side of the unit sensing area SUT may range from 4 to 5 mm, but is not necessarily limited thereto.

Hereinafter, a stacked structure of the touch member TSP will be described with further reference to FIGS. 5 and 6.

Figure 5:
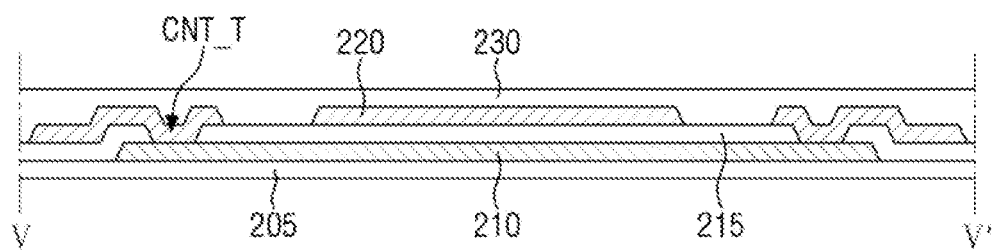
FIG. 5 is a cross-sectional view taken along the lines V-V' of FIG. 4.

FIG. 5 is a cross-sectional view taken along line V-V' of FIG. 4. Line V-V' may substantially overlap the other first connection unit CP1_2 as shown in FIG. 5. FIG. 6 is a cross-sectional view taken along line VI-VI' of FIG. 4.

Figure 6:
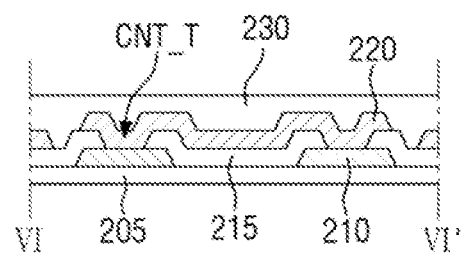
FIG. 6 is a cross-sectional view taken along the lines VI-VI' of FIG. 4.

Referring to FIGS. 4 to 6, the touch member TSP may include a base layer 205, a first touch conductive layer 210 on the base layer 205, a first touch insulating layer 215 on the first touch conductive layer 210, a second touch conductive layer 220 on the first touch insulating layer 215, and a second touch insulating layer 230 covering the second touch conductive layer 220.

The first touch conductive layer 210 may be disposed on the base layer 205. The first touch conductive layer 210 is covered by the first touch insulating layer 215. The first touch insulating layer 215 insulates the first touch conductive layer 210 and the second touch conductive layer 220. The second touch conductive layer 220 is disposed on the first touch insulating layer 215. The second touch insulating layer 230 may at least partially cover and protect the second touch conductive layer 220.

The base layer 205 may include an inorganic material such as glass and/or quartz. For example, the base layer 205 may include silicon oxide ($SiO_2$). The base layer 205 may be the above-described second substrate 102 and/or may perform a similar function (refer to FIG. 2). For example, the first touch conductive layer 210 may be formed on the second substrate 102 (refer to FIG. 2). However, the present disclosure is not necessarily limited thereto. In some embodiments, when the display device 1 (refer to FIG. 1) includes a thin film encapsulation layer, not the second substrate 102 (refer to FIG. 2), the base layer 205 may include a silicon nitride layer, a silicon oxynitride layer, a silicon oxide layer, a titanium oxide layer, or an aluminum oxide layer. Accordingly, in some embodiments, the base layer 205 may be an inorganic layer constituting the thin film encapsulation layer.

Each of the first touch conductive layer 210 and the second touch conductive layer 220 may include a metal or a transparent conductive layer. The metal may include aluminum, titanium, copper, molybdenum, silver, or alloys thereof. The transparent conductive layer may include a transparent conductive oxide such as indium tin oxide (ITO), indium zinc oxide (IZO), zinc oxide (ZnO), or indium tin zinc oxide (ITZO), a conductive polymer such as PEDOT, metal nanowires, and graphene.

The first touch conductive layer 210 and/or the second touch conductive layer 220 may include a multilayered conductive layer. For example, the first touch conductive layer 210 and/or the second touch conductive layer 220 may have a three-layer structure of titanium/aluminum/titanium. As another example, the first touch conductive layer 210 and/or the second touch conductive layer 220 may include at least one metal layer and at least one transparent conductive layer.

In some embodiments, the first touch conductive layer 210 and the second touch conductive layer 220 may include the same material. For example, both the first touch conductive layer 210 and the second touch conductive layer 220 may include aluminum. In an embodiment, the first touch conductive layer 210 and the second touch conductive layer 220 may have a three-layer structure of titanium/aluminum/titanium.

In some embodiments, the first touch conductive layer 210 and the second touch conductive layer 220 may include different materials. For example, the first touch conductive layer 210 may include a metal, and the second touch conductive layer 220 may include a transparent conductive layer.

In an embodiment, the above-described first connection unit CP1 may be formed of the first touch conductive layer 210, and each of the above-described first sensor unit SP1, second sensor unit SP2, and second connection unit CP2 may be formed of the second touch conductive layer 220. However, the present disclosure is not necessarily limited thereto, and the touch conductive layers constituting each member of the sensing electrode may be variously modified.

Each of the first sensor unit SP1 of the first sensing electrode IE1 and the second sensor unit SP2 of the second sensing electrode IE2 may have a planar pattern or a mesh pattern. When each of the first sensor unit SP1 and the second sensor unit SP2 has a planar pattern, the second touch conductive layer 220 constituting the first sensor unit SP1 and the second sensor unit SP2 may be formed as a transparent conductive layer. When each of the first sensor unit SP1 and the second sensor unit SP2 has a mesh pattern, the second touch conductive layer 220 constituting the first sensor unit SP1 and the second sensor unit SP2 may be formed of an opaque material. Hereinafter, an example case where each of the first sensor unit SP1 and the second sensor unit SP2 has a planar pattern will be described, but the present disclosure is not necessarily limited thereto.

The first touch insulating layer 215 and the second touch insulating layer 230 may include an inorganic material or an organic material. In an embodiment, either of the first touch insulating layer 215 and the second touch insulating layer 230 may include an inorganic material, and the other may include an organic material. In an embodiment, the first touch insulating layer 215 may include a silicon nitride layer, a silicon oxynitride layer, a silicon oxide layer, a titanium oxide layer, or an aluminum oxide layer, and the second touch insulating layer 230 may include a layer including at least one of acrylic resin, methacrylic resin, polyisoprene, vinyl resin, epoxy resin, urethane resin, cellulose resin, siloxane resin, polyimide resin, polyamide resin, and perylene resin.

The first touch insulating layer 215 may include a contact hole CNT_T. A part of the first touch conductive layer 210 (for example, the first connection unit CP1) and a part of the second touch conductive layer 220 (for example, the first sensor unit SP1) may be electrically connected through the contact hole CNT_T.

When each of the first sensor unit SP1 and the second sensor unit SP2 has a mesh pattern, the second touch conductive layer 220 constituting the first sensor unit SP1 and the second sensor unit SP2 may be disposed on a non-light emitting area of the display panel. When the second touch conductive layer 220 is disposed in the non-light emitting area, even if an opaque low-resistance metal is applied to the second touch conductive layer 220, light emission is not reduced, and this second touch conductive layer 220 might not be visually recognized by a user.

Hereinafter, the non-touch area NTA will be described.

Again, referring to FIG. 3, a plurality of touch lines are arranged in the non-touch area NTA outside the touch area TA. The touch lines extend from touch pad units TPA1 and TPA2 disposed in the non-touch area NTA located at one side of the touch member TSP.

The plurality of touch lines may include a plurality of touch signal lines. The plurality of touch signal lines may include a plurality of touch driving lines TX and a plurality of touch sensing lines RX. The plurality of touch lines may further include a touch guard line G and/or a touch antistatic line ES.

The touch driving line TX is connected to the first sensing electrode IE1. In an embodiment, a plurality of touch driving lines may be connected to one first sensing electrode IE1. For example, the touch driving lines TX may include first touch driving lines TX1_1, TX2_1, TX3_1, and TX4_1 connected to the lower end of the first sensing electrode IE1, and second touch driving lines TX1_2, TX2_2, TX3_2, and TX4_2 connected to the upper end of the first sensing electrode IE1. The first touch driving lines TX1_1, TX2_1, TX3_1, and TX4_1 may extend from the touch pad unit TPA1 in the first direction DR1 to be connected to the lower end of the first sensing electrode IE1. The second touch driving lines TX1_2, TX2_2, TX3_2, and TX4_2 may extend from the touch pad unit TPA1 in the first direction DR1 and bypass the left edge of the touch area TA to be connected to the upper end of the first sensing electrode IE1.

The touch sensing line RX is connected to the second sensing electrode IE2. In an embodiment, one touch sensing line RX may be connected to one second sensing electrode IE2. Each of the touch sensing lines RX1, RX2, RX3, RX4, RX5, and RX6 may extend from the touch pad unit TPA2 in the first direction DR1 and extend to the right edge of the touch area TA to be connected to the right end of the second sensing electrode IE2.

The touch guard line G is disposed between the touch lines. The touch guard line G may suppress or prevent peripheral touch lines from being affected by voltage changes of the adjacent touch lines. For example, the touch guard line G may minimize the influence of a voltage change of the touch antistatic line ES on the touch area TA, the touch driving line TX, and the touch sensing line RX.

The touch guard line G may include a first touch guard line G1, a second touch guard line G2, a third touch guard line G3, a fourth touch guard line G4, and a fifth touch guard line G5. The first touch guard line G1 may be disposed between the touch sensing line RX and the first touch antistatic line ES1. The second touch guard line G2 may be disposed between the second touch antistatic line ES and the touch sensing line RX. The third touch guard line G3 may be disposed between the first touch driving line TX_1 and the third touch antistatic line ES3. The fourth touch guard line G4 may be disposed between the first touch driving line TX_1 and the second touch driving line TX1_2. The fifth touch guard line G5 may be disposed between the second touch driving line TX_2 and the fourth touch antistatic line ES4.

At least a part of the first touch guard line G1 and at least a part of the fifth touch guard line G5 may be located at the upper side of the touch area TA, and may be spaced apart from each other. For example, the first touch guard line G1 and the fifth touch guard line G5 may be separated from each other, and may not be electrically connected to each other. For example, the touch guard line G might not form a closed loop.

When the display device 1 (refer to FIG. 1) includes components for receiving electromagnetic waves, an electric current may be generated in the touch guard line G by a magnetic field. However, since the first touch guard line G1 and the fifth touch guard line G5 are electrically separated from each other, even if the display device 1 (refer to FIG. 1) receives electromagnetic waves, the electric current induced from the electromagnetic waves might not flow through the touch guard line G, and an unstable voltage may be suppressed and prevented. Accordingly, the touch guard line G may protect the touch area TA, the touch driving line TX, the touch sensing line RX, and the touch guard line G, which are located inside.

The touch antistatic lines ES may be disposed at the outermost sides of the touch lines. In other words, the touch driving line TX, the touch sensing line RX, and the touch guard line G may be located inside the touch member TSP (or inside the display device 1 (refer to FIG. 1)) whereas the antistatic lines ES may be located in a peripheral region outside of the touch member TSP. For example, the antistatic lines ES may overlap the sealing member SL. The first to fourth touch antistatic lines ES1, ES2, ES3, and ES4 may at least partially surround the touch area TA, the touch driving line TX, the touch sensing line RX, and the touch guard line G on a plane formed by first direction DR1 and second direction DR2. The touch antistatic line ES may protect the touch area TA, the touch driving line TX, the touch sensing line RX, and the touch guard line G, located inside, from static electricity. When static electricity is applied from the outside, the applied static electricity may be discharged along the touch antistatic line ES.

In an embodiment, the touch antistatic line ES may include a first touch antistatic line ES1, a second touch antistatic line ES2, a third touch antistatic line ES3, and a fourth touch antistatic line ES4. The first touch antistatic line ES1 may at least partially cover the outer side of the right touch signal line and the outer sides of the touch signal line and the touch guard line G extending from the upper side of the touch area TA in the second direction DR2. The second touch antistatic line ES2 may at least partially cover the inner sides of the touch signal line and the touch guard line G on the right side of the display device 1. The third touch antistatic line ES3 may at least partially cover the inner sides of the touch signal line and touch guard line on the left side of the display device 1, and the inner sides of the touch signal line and the touch guard line G extending from the lower side of the touch area TA in the second direction DR2. The fourth touch antistatic line ES4 may at least partially cover the outer sides of the touch signal line and touch guard line on the left side of the display device, and the outer sides of the touch signal line and the touch guard line G extending from the upper side of the touch area TA in the second direction DR2.

The touch antistatic line ES may generally at least partially surround the touch area TA, the touch driving line TX, the touch sensing line RX, and the touch guard line G in a ring shape, except for some areas, for example, disconnection areas CT. In other words, the touch antistatic line ES might not form a closed loop. At least a part of the first touch antistatic line ES1 and at least a part of the fourth touch antistatic line ES4 may be located at the upper side of the touch area TA, and may be spaced apart from each other. For example, in the disconnection area CT, the first touch antistatic line ES1 and the fourth touch antistatic line ES4 may be separated from each other, and might not be electrically connected to each other. In the disconnection area CT, the end of the first touch antistatic line ES1 and the end of the fourth touch antistatic line ES4 may face each other.

When the display device 1 (refer to FIG. 1) includes components for receiving electromagnetic waves, an electric current may be generated in the touch antistatic line ES by a magnetic field. However, since the first touch antistatic line ES1 and the fourth touch antistatic line ES4 are electrically separated from each other, even if the display device 1 (refer to FIG. 1) receives electromagnetic waves, the electric current induced from the electromagnetic waves might not flow through the touch antistatic line ES, and an unstable voltage may be suppressed and prevented. Accordingly, the touch antistatic line ES may protect the touch area TA, the touch driving line TX, the touch sensing line RX, and the touch guard line G, which are located inside.

The touch antistatic line ES may include an optically transparent metal, and may overlap the sealing member SL (refer to FIG. 2) of the display panel 10 (refer to FIG. 2). Accordingly, since the touch driving line TX, the touch sensing line RX, and the touch guard line G are arranged in an area inside the touch antistatic line ES, the non-touch area NTA may be reduced and the touch area TA may be enlarged. Further, the spacing between the touch lines may be maintained, so that the mutual influence of the touch lines may be suppressed and prevented. Accordingly, the touch member TSP may operate with increased reliability.

The arrangement of the touch antistatic lines ES and a stacked structure around the touch antistatic line ES will be described further with reference to FIG. 7.

Figure 7:
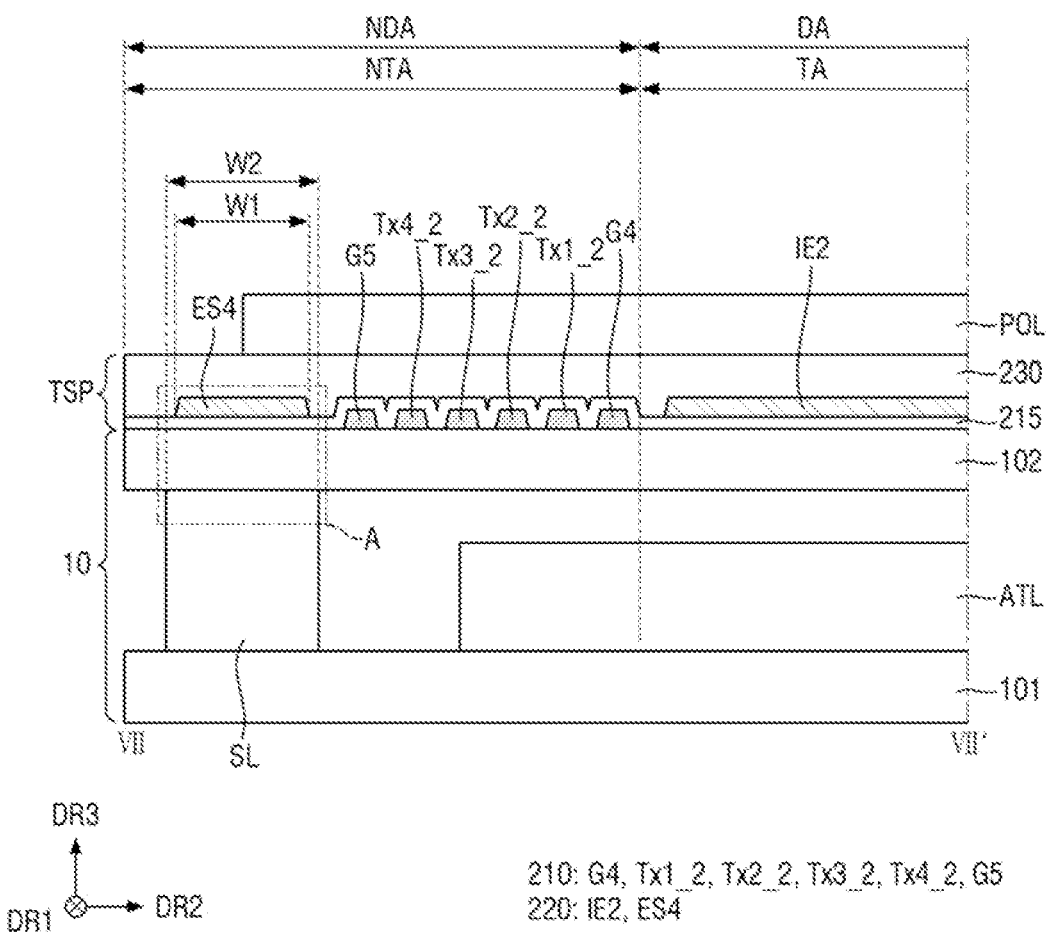
FIG. 7 is a cross-sectional view taken along the lines VII-VII' of FIG. 3.
Figure 8:
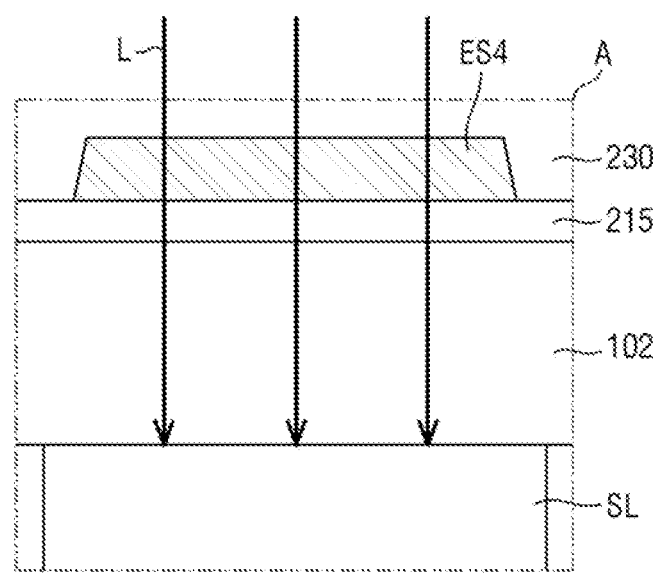
FIG. 8 is an enlarged view of the area A of FIG. 7.

FIG. 7 is a cross-sectional view taken along the lines VII-VII' of FIG. 3. FIG. 8 is an enlarged view of the area A of FIG. 7.

FIG. 7 illustrates the display panel 10 disposed under the touch member TSP and the anti-reflection member POL disposed on the touch member TSP. FIG. 8 illustrates a state in which light L incident on the sealing member SL from the outside passes through the touch antistatic line ES.

Moreover, although it is illustrated in FIGS. 7 and 8 that the first touch conductive layer 210 is directly disposed on the second substrate 102 of the display panel 10, the present disclosure is not necessarily limited thereto. FIG. 7 illustrates a fourth touch antistatic line ES4, a fifth touch guard line G5, second touch driving lines TX1_2, TX2_2, TX3_2, and TX4_2, and a fourth touch guard line G4, and the present disclosure will be described based on these lines. However, descriptions of these lines may also be applied to the touch antistatic line ES, the touch guard line G, the touch driving line TX, and the touch sensing line RX Referring to FIGS. 7 and 8, the fourth touch antistatic line ES4 may be formed on a different layer from the second touch driving lines TX1_2, TX2_2, TX3_2, and TX4_2, the fourth touch guard line G4, and the fifth touch guard line G5, and accordingly may be formed of a different conductive layer.

The first touch conductive layer 210 may further include second touch driving lines TX1_2, TX_2, TX3_2, and TX4_2 and fourth and fifth touch guard lines G4 and G5. For example, the second touch driving lines TX1_2, TX2_2, TX3_2, and TX4_2 and the fourth and fifth touch guard lines G4 and G5 may be formed into the first touch conductive layer 210. Moreover, the first touch conductive layer 210 may further include a touch sensing line RX. The second touch conductive layer 220 may further include a fourth touch antistatic line ES4. In other words, the fourth touch antistatic line ES4 may be formed from the second touch conductive layer 220.

The first touch insulating layer 215 may be disposed on the second touch driving lines TX1_2, TX2_2, TX3_2, and TX4_2 and the fourth and fifth touch guard lines G4 and G5. The fourth touch antistatic line ES4 may be disposed on the first touch insulating layer 215.

Further, although not necessarily limited thereto, the fourth touch antistatic line ES4 may have different light transmittance from the second touch driving lines TX1_2, TX2_2, TX3_2, and TX4_2, the touch sensing line RX, and the fourth and fifth touch guard lines G4 and G5. The fourth touch antistatic line ES4 may include a transparent conductive layer, and the second touch driving lines TX1_2, TX2_2, TX3_2, and TX4_2, the touch sensing line RX, and the fourth and fifth touch guard lines G4 and G5 may include a metal. The metal may be opaque, but the present disclosure is not necessarily limited thereto. For example, the second touch driving lines TX1_2, TX2_2, TX3_2, and TX4_2, the touch sensing line RX, and the fourth and fifth touch guard lines G4 and G5 may include a transparent conductive layer.

A part of the fourth touch antistatic line ES4 may overlap the anti-reflection member POL in the thickness direction (third direction DR3). For example, at least a part of the fourth touch antistatic line ES4 may overlap the anti-reflection member POL in the thickness direction (third direction DR3), and the outer surface of the fourth touch antistatic line ES4 may protrude outward from the outer surface of the anti-reflection member POL. In this case, the anti-reflection member POL may cover a portion of the fourth touch antistatic line ES4. However, the present disclosure is not necessarily limited thereto, and the entire fourth touch antistatic line ES4 may overlap the anti-reflection member POL in the thickness direction (third direction DR3). In this case, the anti-reflection member POL may substantially cover the entire fourth touch antistatic line ES4.

The fourth touch antistatic line ES4 may overlap the sealing member SL of the display panel 10 in the thickness direction (third direction DR3) in the non-touch area NTA and/or the non-display area NDA. For example, the fourth touch antistatic line ES4 located around the outermost touch line may overlap the sealing member SL of the display panel 10 in the thickness direction (third direction DR3).

The width W1 of the fourth touch antistatic line ES4 of the touch member TSP in the second direction DR2 may be less than the width W2 of the sealing member SL of the display panel 10 in the second direction DR2. In this case, the fourth touch antistatic line ES4 may overlap the sealing member SL in the thickness direction (third direction DR3). For example, the entire fourth touch antistatic line ES4 may overlap within the width of the sealing member SL in the thickness direction (the third direction DR3), and a part of the sealing member SL may overlap the fourth touch antistatic line ES4, but the present disclosure is not necessarily limited thereto.

Further, the width W1 of the fourth touch antistatic line ES4 in the second direction DR2 may be larger than the width of each of the second touch driving lines TX1_2, TX2_2, TX3_2, and TX4_2 in the second direction DR2, the width of the touch sensing line RX in the second direction DR2, or the width of each of the fourth and fifth guard lines G4 and G5 in the second direction DR2. Accordingly, even if the fourth touch antistatic line ES4 includes a transparent conductive layer, electrical resistance may be lowered due to the increased conductivity through a wider connection layer.

According to an aspect of the present inventive concept, the area inside the fourth touch antistatic line ES4 containing the second touch driving lines TX1_2, TX2_2, TX3_2, and TX4_2, the touch sensing line RX, and the fourth and fifth touch guard lines G4 and G5 may increase. As the spacing between the touch lines may be maintained, the mutual influence of the touch lines on may be suppressed or prevented, and the arrangement of the touch lines may be simplified. In addition, since the spacing intervals between the first sensing electrode IE1 and the touch line and between the second sensing electrode IE2 and the touch line in the touch area TA may increase, the electrical influence of the touch lines on the first sensing electrode IE1 and the second sensing electrode IE2 may be suppressed or prevented, and the first sensing electrode IE1 and the second sensing electrode IE2 may operate with increased reliability. Further, the fourth touch antistatic line ES4 may overlap the sealing member SL in the thickness direction (third direction DR3), thereby reducing the non-touch area NTA and enlarging the touch area TA.

Moreover, when the fourth touch antistatic line ES4 includes a transparent conductive layer, even if the fourth touch antistatic line ES4 overlaps the sealing member SL in the thickness direction (third direction DR3), the sealing member SL may be cured. For example, the sealing member SL may be cured by light L incident from the outside, and even if the fourth touch antistatic line ES4 overlaps the sealing member SL in the thickness direction (the third direction DR3). For example, when the fourth touch antistatic line ES4 includes a transparent conductive layer, the fourth touch antistatic line ES4 may transmit light L incident from the outside, allowing the sealing member SL to be cured. The light L may include, for example, ultra violet (UV) light, but is not necessarily limited thereto.

Accordingly the fourth touch antistatic line ES4 includes a transparent conductive layer and overlaps the sealing member SL in the thickness direction (third direction DR3), the sealing member SL may be cured while providing an area where the second touch driving lines TX1_2, TX2_2, TX3_2, and TX4_2, the touch sensing line RX, and the fourth and fifth touch guard lines G4 and G5, which are located inside the fourth touch anti-static line ES4, are arranged. Hereinafter, a cross-sectional view of the display panel 10 will be described in detail.

Figure 9:
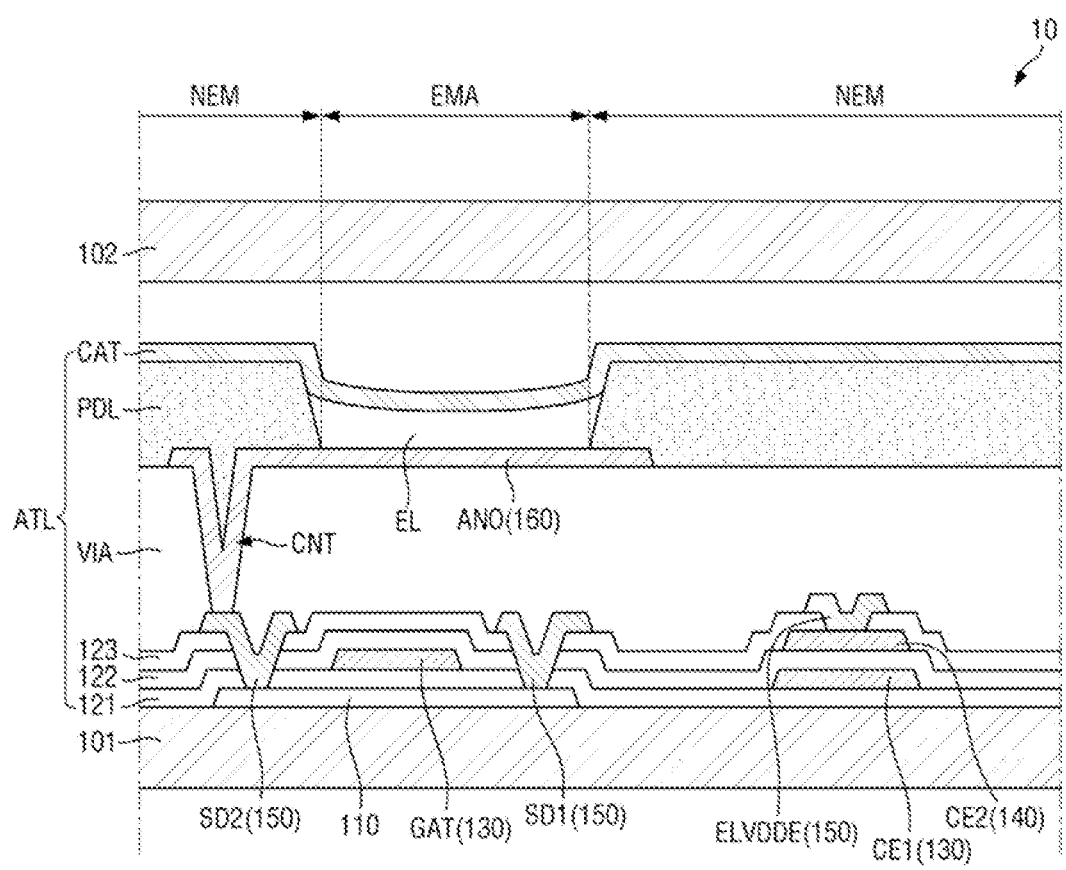
FIG. 9 is a cross-sectional view of a display panel according to an embodiment.

FIG. 9 is a cross-sectional view of a display panel according to an embodiment.

Referring to FIG. 9, a display panel 10 according to an embodiment includes a first substrate 101, a second substrate 102 facing the first substrate 101, and an active element layer ATL disposed on the first substrate 101.

The active element layer ATL may cover most of the area of the first substrate 101, while exposing other areas. The active element layer ATL may include a semiconductor layer 110, a first insulating layer 121, a first gate conductive layer 130, a second insulating layer 122, a second gate conductive layer 140, a third insulating layer 123, a data conductive layer 150, a via layer VIA, an anode electrode ANO or an anode conductive layer 160, a pixel defining layer PDL including an opening exposing the anode electrode ANO, a light emitting layer EL disposed in the opening of the pixel defining layer PDL, and a cathode electrode CAT disposed on the pixel defining layer PDL. These respective layers may be sequentially stacked in the above-described order. Moreover, each of the layers may be formed as a single layer, or may be formed as a stacked layer including a plurality of layers. Another layer may be further disposed between the respective layers.

The semiconductor layer 110 is disposed on the first substrate 101. The semiconductor layer 110 forms a channel of a thin film transistor for each pixel. The semiconductor layer 110 may include polycrystalline silicon. However, the present disclosure is not necessarily limited thereto, and the semiconductor layer 110 may include single crystal silicon, low-temperature polycrystalline silicon, amorphous silicon, or an oxide semiconductor. The oxide semiconductor may include, for example, a two-component compound (ABx), a three-component compound (ABxCy), and a four-component compound (ABxCyDz), each selectively containing zinc (Zn), gallium (Ga), tin (Sb), titanium (Ti), aluminum (Al), hafnium (Hf), zirconium (Zr), and magnesium (Mg).

The first insulating layer 121 is disposed on the semiconductor layer 110. The first insulating layer 121 may be a first gate insulating layer having a gate insulating function. The first insulating layer 121 may include a silicon compound, a metal oxide, or the like.

The first gate conductive layer 130 is disposed on the first insulating layer 121. The first gate conductive layer 130 may include a gate electrode GAT including a thin film transistor for each sub-pixel PXS, a scan line connected to the gate electrode GAT, and a storage capacitor first electrode CE1.

The first gate conductive layer 130 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The second insulating layer 122 may be disposed on the first gate conductive layer 130. The second insulating layer 122 may be an interlayer insulating layer or a second gate insulating layer. The second insulating layer 122 may include a silicon compound, a metal oxide, or the like.

The second gate conductive layer 140 is disposed on the second insulating layer 122. The second gate conductive layer 140 may include a storage capacitor second electrode CE2. The second gate conductive layer 140 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second gate conductive layer 140 may be made of the same material as the first gate conductive layer 130, but the present disclosure is not necessarily limited thereto.

The third insulating layer 123 is disposed on the second gate conductive layer 140. The third insulating layer 123 may be an interlayer insulating layer. The third insulating layer 123 may include a silicon compound, a metal oxide, or the like.

The data conductive layer 150 is disposed on the third insulating layer 123. The data conductive layer 150 may include a first electrode SD1 and a second electrode SD2 formed of a thin film transistor for each pixel. The first electrode SD1 and second electrode SD2 may be electrically connected to a source region and a drain region of the semiconductor layer 110 through a contact hole penetrating the third insulating layer 123, the second insulating layer 122, and the first insulating layer 121. A first power voltage electrode ELVDDE of each pixel may also be formed of the data conductive layer 150. The first power voltage electrode ELVDDE may be electrically connected to the storage capacitor second electrode CE2 through a contact hole penetrating the third insulating layer 123.

The data conductive layer 150 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The data conductive layer 150 may be a single-layer film or a multi-layer film. For example, the data conductive layer 150 may have a stacked structure of Ti/Al/Ti, Mo/Al/Mo, Mo/AlGe/Mo, or Ti/Cu.

The via layer VIA is disposed on the data conductive layer 150. The via layer VIA covers at least a portion of the data conductive layer 150. When the via layer VIA is formed of an organic layer, the via layer VIA may have a substantially flat upper surface, though a portion of the surface may form to an underlying step. The via layer VIA may include an organic insulating material such as acrylic resin, epoxy resin, phenolic resin, polyamide resin, polyimide resin, unsaturated polyester resin, polyphenylene ether resin, polyphenylene sulfide resin, or benzocyclobutene (BCB).

The anode electrode ANO is disposed on the via layer VIA. The anode electrode ANO may be a pixel electrode provided for each pixel.

The anode electrode ANO may be connected to the second electrode SD2 of the thin film transistor through a contact hole penetrating through the via layer VIA. The anode electrode ANO may at least partially overlap the light emitting area EMA of the pixel PX.

The anode electrode ANO may have, but is not necessarily limited to, a stacked layer structure in which a high-work-function material layer including indium-tin-oxide (ITO), indium-zinc-oxide (IZO), zinc oxide (ZnO), or indium oxide ($In_2O_3$), and a reflective material layer including silver (Ag), magnesium (Mg), aluminum (Al), platinum (Pt), lead (Pb), gold (Au), nickel (Ni), neodymium (Nd), iridium (Ir), chromium (Cr), Lithium (Li), calcium (Ca) or a mixture thereof are stacked. The high-work-function material layer may be disposed over the reflective material layer to be closer to the light emitting layer EL. The anode electrode ANO may have a multi-layer structure of ITO/Mg, ITO/MgF, ITO/Ag, and ITO/Ag/ITO, but is not necessarily limited thereto.

The pixel defining layer PDL may be disposed on the anode electrode ANO. The pixel defining layer PDL may be made of an organic insulating material or an inorganic insulating material. For example, the pixel defining layer PDL may include at least one of a polyimide resin, an acrylic resin, a silicone compound, and a polyacrylic resin.

The light emitting layer EL is disposed on the anode electrode ANO exposed by the pixel defining layer PDL. The light emitting layer EL may include an organic material layer. The organic material layer of the light emitting layer may include an organic light emitting layer, and may further include a hole injection/transporting layer and/or an electron injection/transporting layer.

The cathode electrode CAT may be disposed on the light emitting layer EL. The cathode electrode CAT may cover the light emitting layer EL, and may be disposed on the pixel defining layer PDL. The cathode electrode CAT may be a common electrode that is disposed without distinction of pixels. The cathode electrode CAT may be conformed to the underlying structure so as to form with the step of the underlying structure. The anode electrode 160, the light emitting layer EL, and the cathode electrode CAT may together constitute an organic light emitting element.

The cathode electrode CAT may include a low-work-function material layer including Li, Ca, LiF/Ca, LiF/Al, Al, Mg, Ag, Pt, Pd, Ni, Au Nd, Ir, Cr, BaF, Ba, a compound thereof, or a mixture thereof (for example, a mixture of Ag and Mg). The cathode electrode CAT may further include a transparent metal oxide layer disposed on the low-work-function material layer.

The second substrate 102 is disposed on the cathode electrode CAT. The cathode electrode CAT and the second substrate 102 may be spaced apart from each other, but the present disclosure is not necessarily limited thereto.

Hereinafter, other embodiments will be described. In the following embodiments, descriptions of the same configurations as those of the previously described embodiments may omitted or simplified, and differences will be mainly described.

Figure 10:
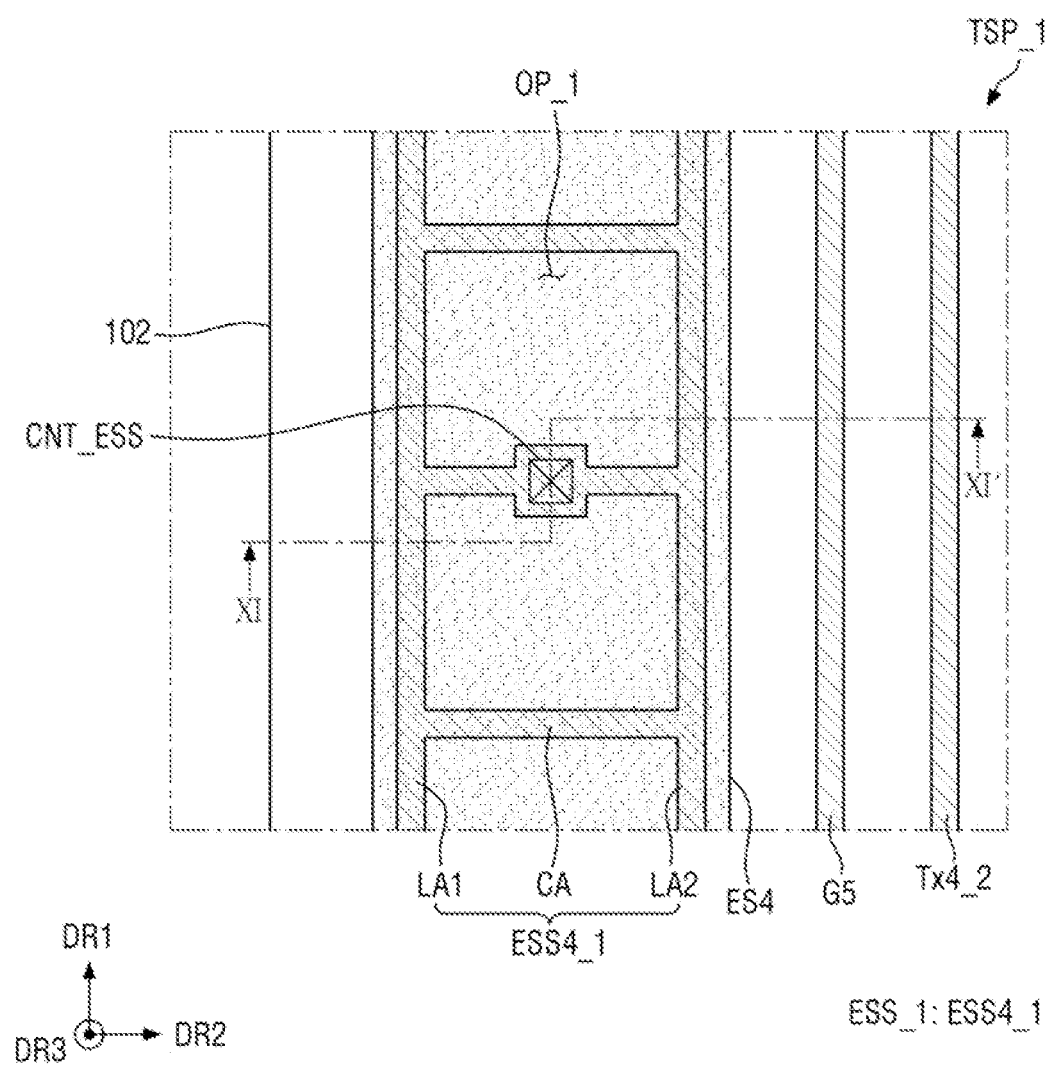
FIG. 10 is an enlarged view of a part of a schematic plan layout view of a touch member according to an embodiment.
Figure 11:
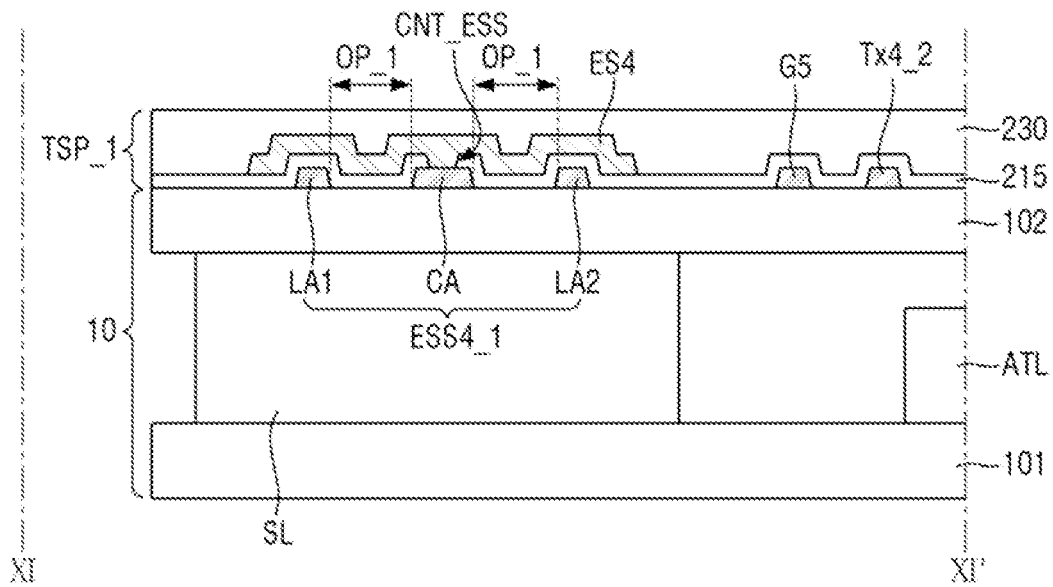
FIG. 11 is a cross-sectional view taken along the line XI-XI' of FIG. 10.

FIG. 10 is an enlarged view of a part of a schematic plan layout view of a touch member according to another embodiment. FIG. 11 is a cross-sectional view taken along the line XI-XI' of FIG. 10.

Referring to FIGS. 10 and 11, a touch member TSP_1 according to the present embodiment may be different from the embodiment of FIG. 7 in that it further includes a sub-touch antistatic line ESS_1.

The touch member TSP_1 according to the present embodiment may further include a sub-touch antistatic line ESS_1 disposed under the touch antistatic line ES. In this embodiment, the sub-touch antistatic line ESS_1 may include a fourth sub-touch antistatic line ESS4_1, and the fourth sub-touch antistatic line ESS4_1 may be disposed under the fourth touch antistatic line ES4. The first touch insulating layer 215 may be disposed on the fourth sub-touch antistatic line ESS4_1, and the fourth touch antistatic line ES4 may be disposed on the first touch insulating layer 215. The fourth sub-touch antistatic line ESS4_1 and the fourth touch antistatic line ES4 may be electrically connected through a through hole CNT_ESS that penetrates the first touch insulating layer 215 to expose the fourth sub-touch antistatic line ESS4_1.

The fourth sub-touch antistatic line ESS4_1 may be disposed on the second substrate 102 of the display panel 10. In this case, the first touch conductive layer 210 may further include a fourth sub-touch antistatic line ESS4_1. For example, the fourth sub-touch antistatic line ESS4_1 may be formed from the first touch conductive layer 210. The fourth sub-touch antistatic line ESS4_1 may have lower light transmittance than the fourth touch antistatic line ES4, and may have higher electrical conductivity than the fourth touch antistatic line ES4.

The entire area of the fourth sub-touch antistatic line ESS4_1 may be overlapped the fourth touch antistatic line ES4, but the present disclosure is not necessarily limited thereto, and at least a part of the fourth sub-touch antistatic line ESS4_1 may be disposed outside the fourth touch antistatic line ES4.

The fourth sub-touch antistatic line ESS4_1 may have a specific pattern. For example, the fourth sub-touch antistatic line ESS4_1 may include two extension portions LA1 and LA2 extending in the first direction DR1, and a plurality of connection portions CA extending between the two extension portions LA1 and LA2 in the second direction DR2 to connect the two extension portions LA1 and LA2. Although it is shown in FIGS. 10 and 11 that the fourth sub-touch antistatic line ESS4_1 is in contact with the fourth touch antistatic line ES4 through a through hole CNT_ESS in the connection portion CA, the present disclosure is not necessarily limited thereto. The number and position of the through hole CNT_ESS may vary.

Further, the fourth sub-touch antistatic line ESS4_1 may be in direct contact with the fourth touch antistatic line ES4. For example, the first touch insulating layer 215 might not be disposed between the fourth touch antistatic line ES4 and the fourth sub-touch antistatic line ESS4_1, and the fourth touch antistatic line ES4 and the fourth sub-touch antistatic line ESS4_1 may be in direct contact with each other. In this case, the through hole CNT_ESS might not be present.

The fourth sub-touch antistatic line ESS4_1 may include an opening OP_1. The opening OP_1 may be defined by the extension portions LA1 and LA2 and connection portion CA of the fourth sub-touch antistatic line ESS4_1. The opening OP_1 may expose the second substrate 102 of the display panel 10. The opening OP_1 may at least partially overlap the sealing member SL of the display panel 10.

Accordingly, even if the fourth sub-touch antistatic line ESS4_1 has lower light transmittance than the fourth touch antistatic line ES4, external light may transmit past fourth sub-touch antistatic line ESS4_1 through the opening OP_1. Therefore, even if the touch member TSP_1 further includes the fourth sub-touch antistatic line ESS4_1, the sealing member SL of the display panel 10 may be cured by UV light or the like.

Although not necessarily illustrated, the sub-touch antistatic line ESS_1 may further include a first sub-touch antistatic line ESS1_1, a second sub-touch antistatic line ESS2_1, and a third sub-touch antistatic line ESS3_1. Each of the first to third sub-touch antistatic lines ESS1_1, ESS2_1, and ESS3_1 may be disposed under each of the first to third touch antistatic lines ES1, ES2, and ES3. As described above, the description of the fourth sub-touch antistatic line ESS4_1 may be applied to the first to third sub-touch antistatic lines ESS1_1, ESS2_1, and ESS3_1.

Even in this case, the area where the touch lines of the touch member TSP_1 are arranged may allow sufficient transmission of light, and the sealing member SL may be cured. Moreover, since the touch member TSP_1 further includes the fourth sub-touch antistatic line ESS4_1 and is electrically connected to the fourth-touch antistatic line ES4, the fourth touch antistatic line ES4 and the fourth sub-touch antistatic line ESS4_1 may protect the touch area (TA, refer to FIG. 3), the touch driving line (TX, refer to FIG. 3), the touch sensing line (RX, refer to FIG. 3), and the touch guard line (G, refer to FIG. 3), which are located inside the fourth touch antistatic line ES4 and the fourth sub-touch antistatic line ESS4_1, from static electricity.

When the touch member TSP_1 further includes the sub-touch antistatic line ESS_1, a part of the sub-touch antistatic line ESS_1 may be disposed in the disconnection area CT of the touch antistatic line ES. Accordingly, the antistatic effect of the touch antistatic line ES in the disconnection area CT may be increased. To further explain this, FIGS. 12 and 13 are referenced in the following description.

Figure 12:
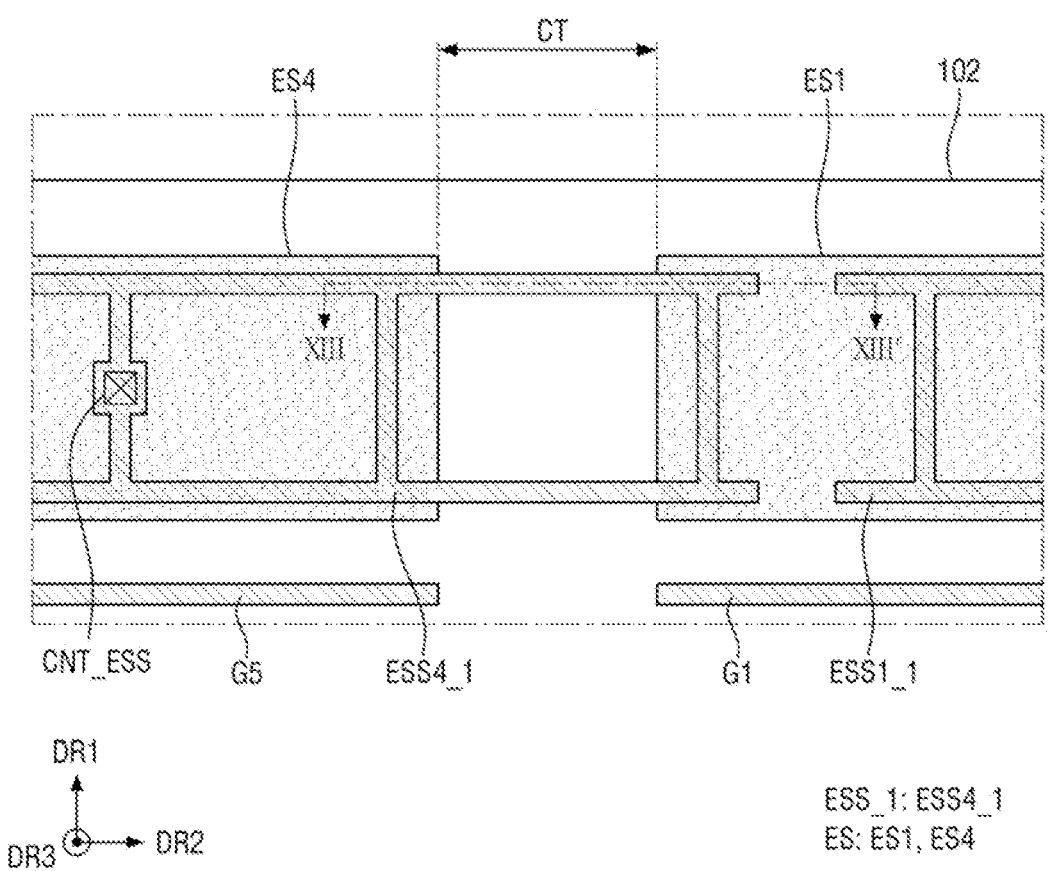
FIG. 12 is an enlarged view of a part of a schematic plan layout view of the touch member of FIG. 10.

FIG. 12 is an enlarged view of a part of a schematic plan layout view of the touch member of FIG. 10. FIG. 13 is a cross-sectional view taken along the line XIII-XIII' of FIG. 12. FIG. 12 shows a schematic plan layout view of the periphery of the disconnection area CT of the touch antistatic line ES, which is different from the area shown in FIG. 10.

Figure 13:
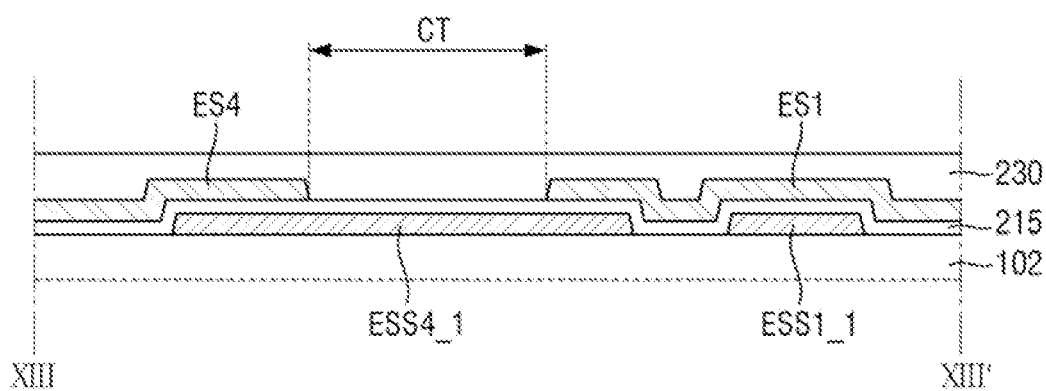
FIG. 13 is a cross-sectional view taken along the line XIII-XIII' of FIG. 12.

Referring to FIGS. 12 and 13, at least a part of the sub-touch antistatic line ESS_1 of the touch member TSP_1 according to the present embodiment may be disposed in the disconnection area CT of the touch antistatic line ES.

The touch antistatic line ES may include a disconnection area CT where the first touch antistatic line ES1 and the fourth touch antistatic line ES4 and are not electrically connected. When the touch member TSP_1 includes the sub-touch antistatic line ESS_1, at least a part of the sub-touch antistatic lime ESS_1 may be disposed in the disconnection area CT.

The fourth sub-touch antistatic line ESS4_1 disposed under the fourth-touch anti-static line ES4 may further extend from one end of the fourth touch antistatic line ES4 toward the first touch antistatic line ES1 in the second direction DR2. The fourth sub-touch antistatic line ESS4_1 may extend outward from one end of the fourth touch antistatic line ES4 in the second direction DR2, and thus at least a part of the fourth sub-touch antistatic line ESS4_1 may be disposed in the disconnection area CT of the touch antistatic line ES. Furthermore, the fourth sub-touch antistatic line ESS4_1 may further extend in the second direction DR2, and may overlap at least a part of the first touch antistatic line ES1 in the thickness (third direction DR3), but the present disclosure is not necessarily limited thereto.

The fourth sub-touch antistatic line ESS4_1 may be spaced apart from the first sub-touch antistatic line ESS1_1 disposed under the first touch antistatic line ES1, and accordingly may not be electrically connected thereto. Therefore, the sub-touch antistatic line ESS might not form a closed loop.

When at least a part of the fourth sub-touch antistatic line ESS4_1 is disposed in the disconnection area CT of the touch antistatic line ES, a portion of the disconnection area CT of the touch antistatic line ES may be covered with the sub-touch antistatic line ESS_1. Therefore, due to the sub-touch antistatic line ESS_1 disposed in the disconnection area CT, it is possible to protect the touch area (TA, refer to FIG. 3), the touch drive line (TX, refer to FIG. 3), the touch sensing line (RX, refer to FIG. 3), and the touch guard line (G, refer to FIG. 3), which are located inside, from static electricity generated near the disconnection area CT of the touch antistatic line ES. Accordingly, the touch area (TA, refer to FIG. 3), the touch drive line (TX, refer to FIG. 3), the touch sensing line (RX, refer to FIG. 3), and the touch guard line (G, refer to FIG. 3) may be protected from static electricity.

Figure 14:
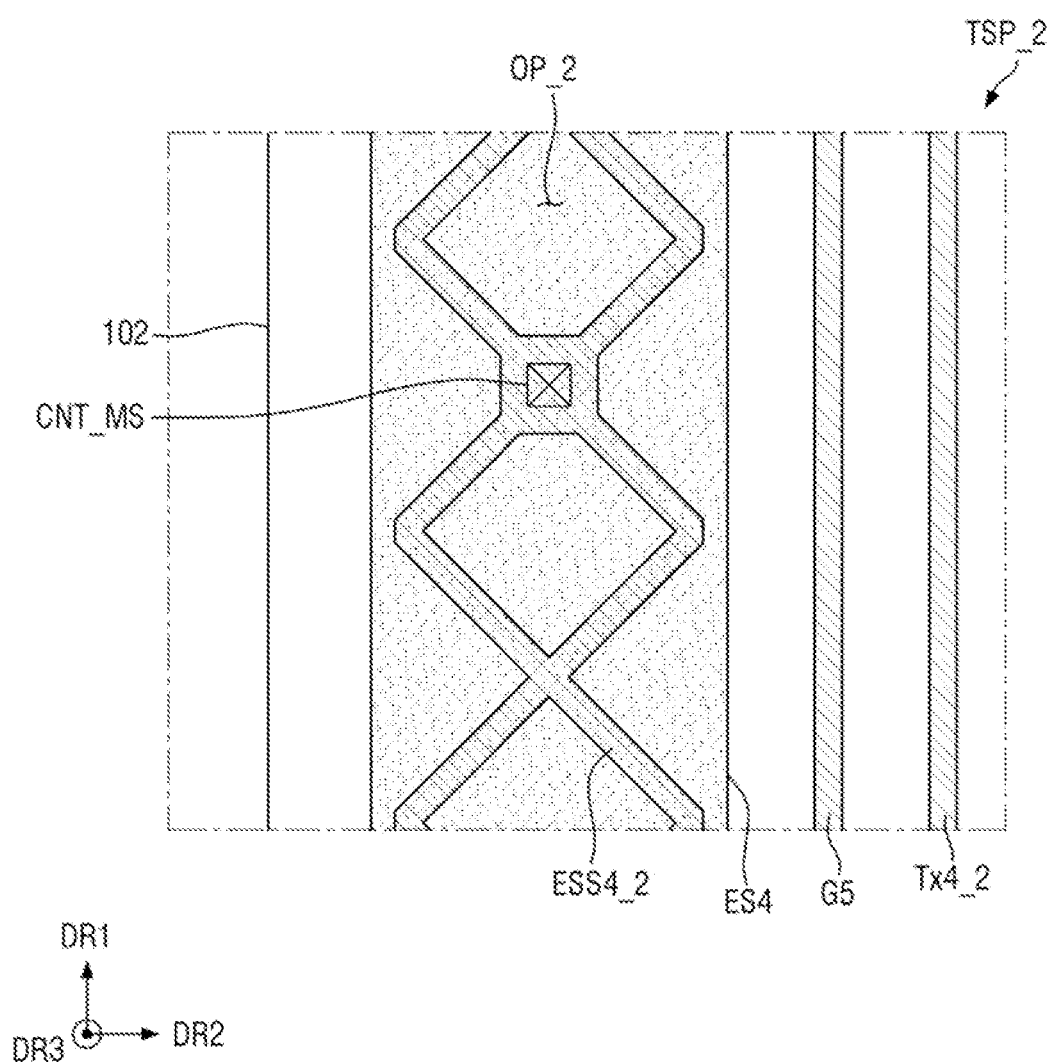
FIG. 14 is an enlarged view of a part of a schematic plan layout view of a touch member according to an embodiment.

FIG. 14 is an enlarged view of a part of a schematic plan layout view of a touch member according to an embodiment.

Referring to FIG. 14, a sub-touch antistatic line ESS_2 of a touch member TSP_2 according to the present embodiment may include a pattern different from that of the embodiment of FIG. 10 in a plan view.

Portions of the fourth sub-touch antistatic line ESS4_2 according to the present embodiment may extend in a direction inclined with respect to the first direction DR1 and the second direction DR2. For example, the fourth sub-touch antistatic line ESS4_2 may substantially extend in a direction in which the fourth touch antistatic line ES4 extends, while portions thereof may extend in zig-zag pattern in directions inclined with respect to the first direction DR1 and the second direction DR2. The fourth sub-touch antistatic line ESS4_2 may define an opening OP_2, and may be electrically connected to the fourth touch antistatic line ES4 through a contact hole CNT_MS.

However, the planar pattern of the fourth sub-touch antistatic line ESS4_2 is not necessarily limited thereto, and the fourth sub-touch antistatic line ESS4_2 may have a mesh shape.

Even in this case, the area of an area where the touch lines of the touch member TSP_2 are arranged may allow sufficient transmission of light, and the sealing member SL may be cured. Moreover, since the fourth sub-touch antistatic line ESS4_2 may be formed in various patterns in a plan view, various arrangements of the fourth sub-touch antistatic line ESS4_2 are possible.

Figure 15:
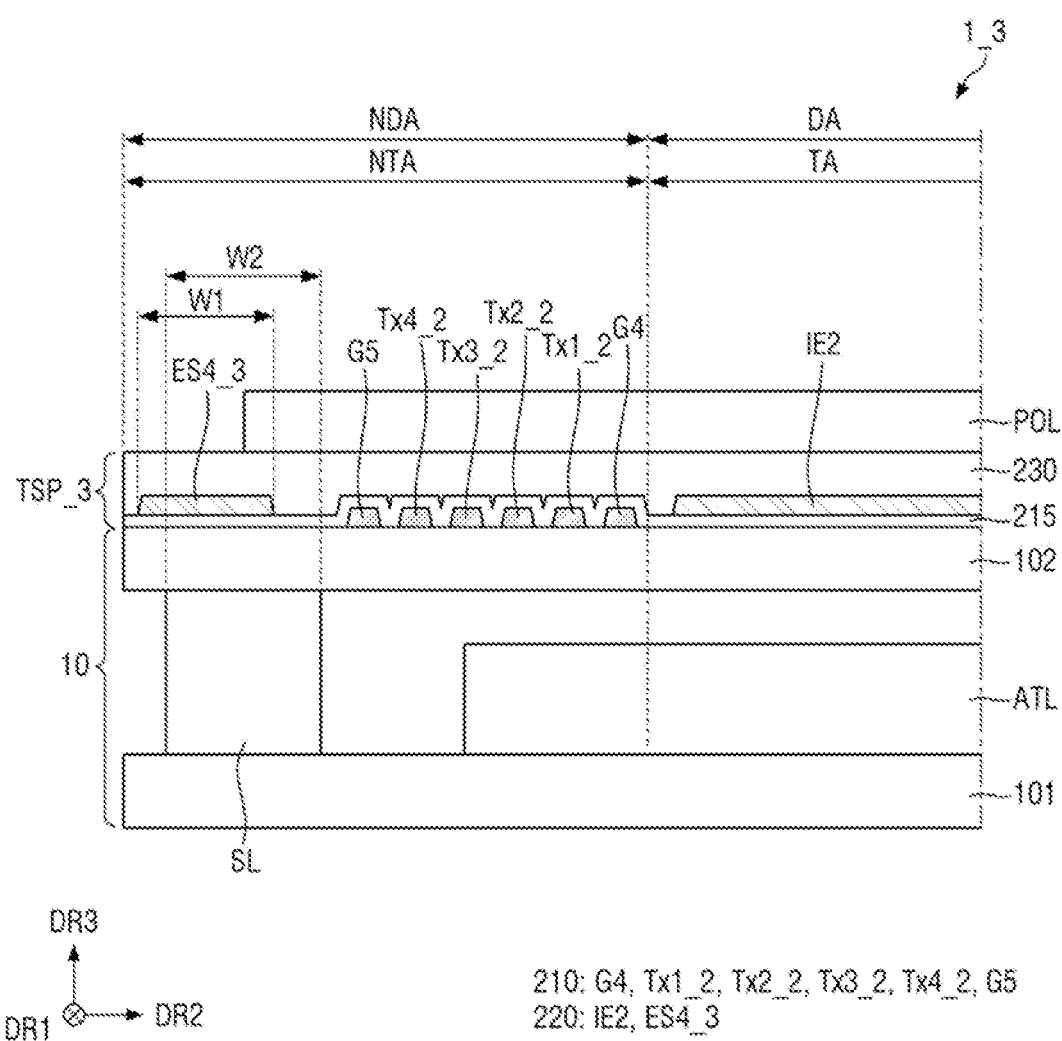
FIG. 15 is a partial cross-sectional view of a display device according to an embodiment.

FIG. 15 is a partial cross-sectional view of a display device according to an embodiment.

Referring to FIG. 15, the present embodiment is different from the embodiment of FIG. 7 in that at least a part of the touch antistatic line ES of a touch member TSP_3 of a display device 1_3 according to the present embodiment may protrude in the second direction D2 outward from the sealing member SL of the display panel 10.

A part of the fourth touch antistatic line ES4_3 according to the present embodiment may still overlap the sealing member SL in the thickness direction (third direction DR3). The outer surface of the fourth touch antistatic line ES4_3 may protrude outward from the outer surface of the sealing member SL.

Although FIG. 15 illustrates a case where the outer surface of the fourth touch antistatic line ES4_3 protrudes outward from the outer surface of the sealing member SL, the present disclosure is not necessarily limited thereto, and the inner surface of the fourth touch antistatic line ES4_3 may extend past the inner surface of the sealing member SL in the second direction D2.

Even in this case, a large portion of an area where the touch lines of the touch member TSP_3 are arranged may be utilized, and further allow sufficient transmission of light, and the sealing member SL may be cured. Moreover, since the fourth antistatic line ES4_3 is disposed outward, a larger area may be provided for the touch area (TA, refer to FIG. 3), the touch driving line (TX, refer to FIG. 3), the touch sensing line (RX, refer to FIG. 3), and the touch guard line (G, refer to FIG. 3).

Figure 16:
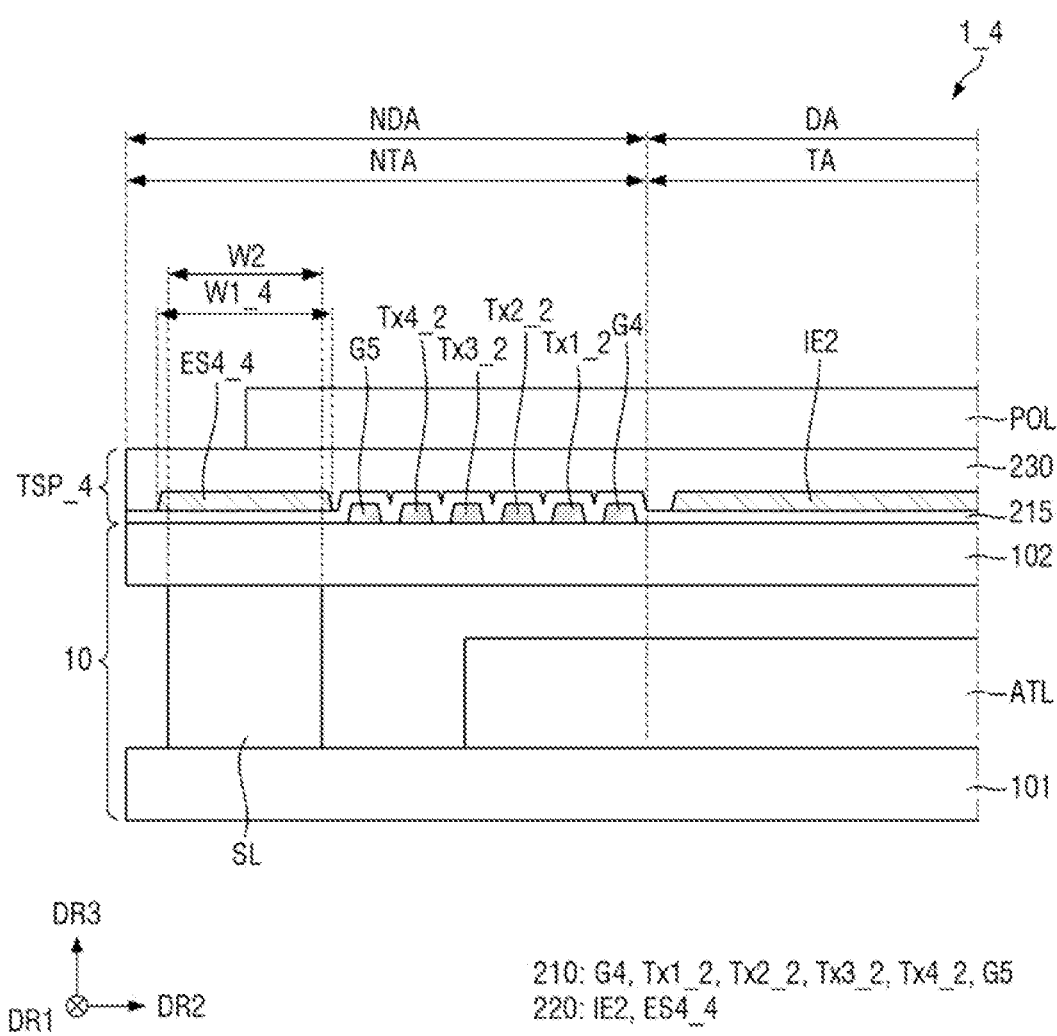
FIG. 16 is a partial cross-sectional view of a display device according to an embodiment.

FIG. 16 is a partial cross-sectional view of a display device according to an embodiment.

Referring to FIG. 16, the present embodiment is different from the embodiment of FIG. 7 in that the width of the touch antistatic line ES of a touch member TSP_4 of a display device 1_4 according to the present embodiment ma be larger than the width of the sealing member SL of the display panel 10.

The width W1_4 of the fourth touch antistatic line ES4_4 according to the present embodiment may be larger than the width W2 of the sealing member SL of the display panel 10. In this case, the fourth touch antistatic line ES4_4 may protrude outward from the outer surface of the sealing member SL in the second direction D2, and the fourth touch antistatic line ES4_4 may additionally protrude inward past the inner surface of the sealing member SL in the second direction D2, but the present disclosure is not necessarily limited thereto.

Even in this case, the area where the touch lines of the touch member TSP_4 are arranged may allow sufficient transmission of light, and the sealing member SL may be cured. Moreover, as the width of the touch antistatic line ES increases, the electrical resistance of the touch antistatic line ES may be lowered, and thus it is possible to protect the touch area (TA, refer to FIG. 3), the touch driving line (TX, refer to FIG. 3), the touch sensing line (RX, refer to FIG. 3), and the touch guard line (G, refer to FIG. 3), from static electricity.

Figure 17:
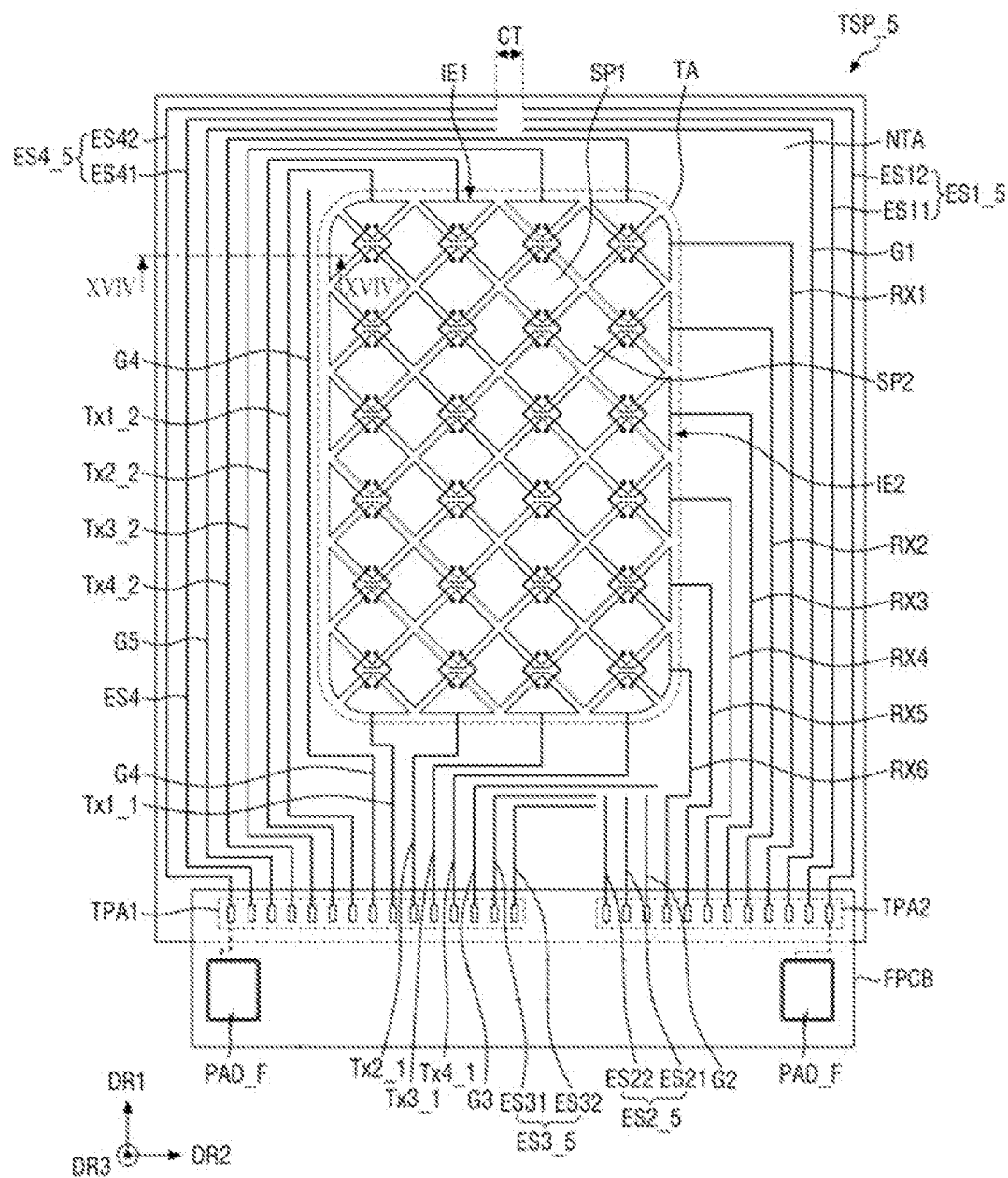
FIG. 17 is a schematic plan layout view of a touch member according to an embodiment.
Figure 18:
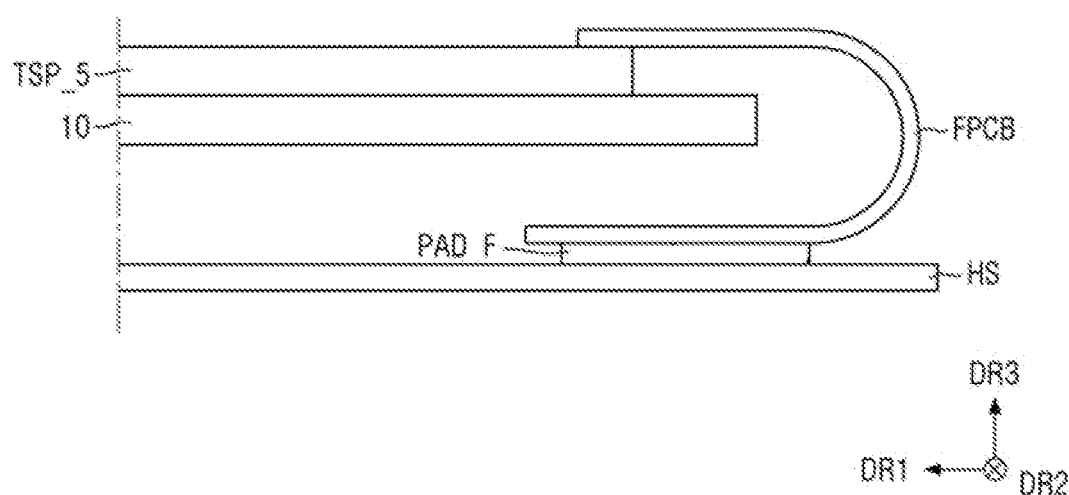
FIG. 18 is a side view of a touch member according to an embodiment.
Figure 19:
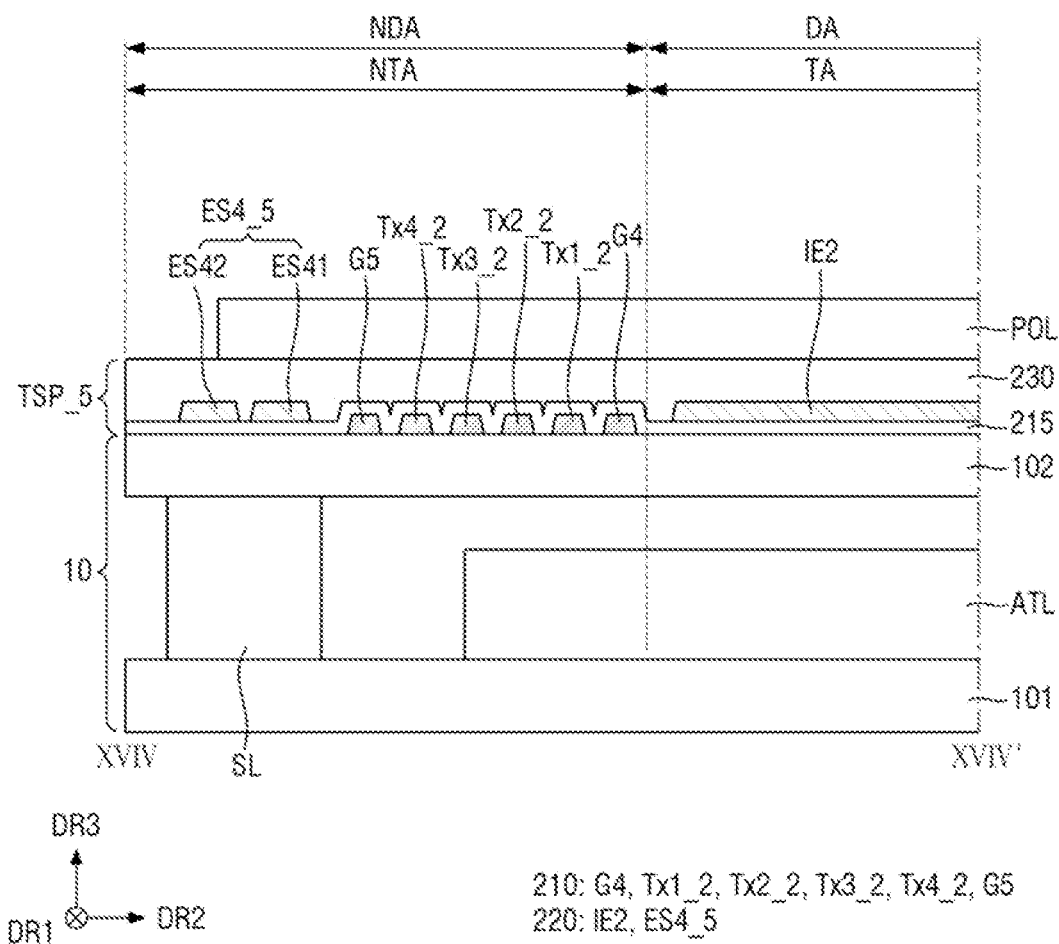
FIG. 19 is a cross-sectional view taken along the line XVIV-XVIV' of FIG. 17.

FIG. 17 is a schematic plan layout view of a touch member according to an embodiment. FIG. 18 is a side view of a touch member according to an embodiment. FIG. 19 is a cross-sectional view taken along the line XVIV-XVIV' of FIG. 17.

Referring to FIGS. 17 to 19, the present embodiment is different from the embodiment of FIG. 3 in that touch antistatic lines ES1, ES2, ES3, ES4 of a touch member TSP_5 include first and second lines ES11, ES12, ES21, ES22, ES31, ES32, ES41, and ES42, respectively.

The fourth touch antistatic line ES4 of the touch member TSP_5 according to the present embodiment may include a first line ES41 and a second line ES42 spaced apart from each other, and the second line ES42 may be disposed outside the first line ES41. The first line ES41 and the second line ES42 may extend in parallel directions. The entire first line ES41 of the fourth touch antistatic line ES4 may overlap the anti-reflection member POL in the thickness direction (third direction DR3). At least a part of the second line ES42 of the fourth touch antistatic line ES4 may a portion of the anti-reflection member POL in the thickness direction (third direction DR3).

The touch member TSP_5 according to the present embodiment may further include a flexible printed circuit board FPCB. The flexible printed circuit board FPCB may include a flexible material, and may be warped or bent. The flexible printed circuit board FPCB may output a signal required for driving and transmit the signal to each touch signal line.

The flexible printed circuit board FPCB may include an intermediate pad PAD_F. Although not necessarily shown, the intermediate pad PAD_F may be electrically connected to the second line ES42 of the fourth touch antistatic line ES4 through a contact hole or the like. The intermediate pad PAD_F may be disposed on the flexible printed circuit board FPCB and exposed to the outside.

The touch member TSP_5 may further include a bracket HS. The bracket HS may be disposed under the touch member TSP_5 and the display panel 10. Although it is shown in FIG. 18 that the bracket HS is disposed under the touch member TSP_5 and the display panel 10, the present disclosure is not necessarily limited thereto, and the bracket HS may at least partially surround the touch member TSP_5 and the display panel 10. In this case, the bracket HS may accommodate the touch member TSP_5 and the display panel 10.

The bracket HS may be in contact with the intermediate pad PAD_F of the flexible printed circuit board FPCB in the state where the flexible printed circuit board FPCB is bent. In this case, static electricity applied to the second line ES42 of the fourth touch antistatic line ES4 may be discharged through the bracket HS via the intermediate pad PAD_F.

Even in this case, the area of an area where the touch lines of the touch member TSP_4 are arranged may allow sufficient transmission of light, and the sealing member SL may be cured.

Moreover, the first line ES41 of the fourth touch antistatic line ES4 may be covered by the anti-reflection member POL to suppress or prevent external static electricity from reaching the first line ES41 of the fourth touch antistatic line ES4. Further, since at least a part of the second line ES42 of the fourth touch antistatic line ES4 protrudes to the outside of the anti-reflection member POL, even when the first line ES41 is not covered by the anti-reflection member POL, static electricity applied to the second line ES42 may be discharged through the bracket HS. In this case, it is possible to discharge static electricity regardless of the amount of static electricity applied to the second line ES42 partially exposed to the outside.

Although embodiments of the present inventive concepts have been disclosed for illustrative purposes, those skilled in the art will appreciate that various modifications, additions and substitutions are possible, without departing from the scope and spirit of the invention as disclosed in the accompanying claims.

What is claimed is:

1. A display device, comprising:
   a display panel including a first substrate, a second substrate, an active element layer disposed on the first substrate, and a sealing member coupling the first substrate and the second substrate to each other; and
   a touch member disposed on the display panel and including a touch signal line, a touch antistatic line, and a sub-touch antistatic line,
   wherein the touch antistatic line is disposed outside of the touch signal line and at least partially overlaps the sealing member,
   wherein the touch antistatic line laterally surrounds the display panel and comprises a first touch antistatic line and a second touch antistatic line,
   wherein a first end of the first touch antistatic line is disposed adjacent to a second end of the second touch antistatic line with a disconnection area therebetween, and
   wherein a portion the sub-touch antistatic line is disposed in the disconnection area.

2. The display device of claim 1,
   wherein the touch signal line includes a first touch conductive layer, and the touch antistatic line includes a second conductive layer different from the first touch conductive layer.

3. The display device of claim 2,
   wherein the first touch conductive layer includes a metal and is opaque to visible light, and the second touch conductive layer includes a metal and is transparent to visible light.

4. The display device of claim 1,
wherein the sub-touch antistatic line at least partially overlaps the touch antistatic line, and
wherein the sub-touch antistatic line is electrically connected to the touch antistatic line.

5. The display device of claim 1,
wherein the first touch antistatic line and the second touch antistatic line are electrically disconnected from each other.

6. The display device of claim 1, further comprising:
an anti-reflection member disposed on the touch member,
wherein the touch antistatic line includes a first line and a second line spaced apart from the first line, and
wherein the first line entirely overlaps the anti-reflection member, and the second line at least partially overlaps the anti-reflection member.

7. The display device of claim 1,
wherein a width of the touch antistatic line is less than a width of the sealing member.

8. The display device of claim 1,
wherein an outer surface of the touch antistatic line protrudes outward from an outer surface of the sealing member.

9. The display device of claim 1,
wherein the touch member further includes a touch guard line disposed between the touch signal line and the touch antistatic line.

10. A display device, comprising:
a display panel including a first substrate, a second substrate, an active element layer disposed on the first substrate, and a sealing member coupling the first substrate and the second substrate to each other; and
a touch member disposed on the display panel,
wherein the touch member includes:
a first touch conductive layer including a touch signal line and a sub-touch antistatic line at least partially overlapping a touch antistatic line;
a first touch insulating layer disposed on the first touch conductive layer; and
a second touch conductive layer disposed on the first touch insulating layer and including the touch antistatic line,
wherein the sub-touch antistatic line comprises two extension portions and a plurality of connection portions extending between the two extension portions, wherein the two extension portions and the plurality of connection portions are disposed on a same plane of the first touch conductive layer, and wherein the two extension portions and the plurality of connection portions form a plurality of openings arranged in an extending direction of the touch antistatic line in a plan view that overlaps the sealing member of the display panel, and
wherein the touch antistatic line is disposed above and vertically overlaps the sub-touch antistatic line.

11. The display device of claim 10,
wherein light transmittance of the second touch conductive layer is higher than light transmittance of the first touch conductive layer.

12. The display device of claim 11,
wherein the second touch conductive layer includes a metal that is transparent to visible light, and the first conductive layer includes a metal that is opaque to visible light.

13. The display device of claim 10,
wherein the touch antistatic line is electrically connected to the sub-touch antistatic line through a through hole penetrating the first touch insulating layer.

14. The display device of claim 10,
wherein light transmittance of the sub-touch antistatic line is lower than light transmittance of the touch antistatic line.

15. The display device of claim 10,
wherein a width of the touch antistatic line is less than a width of the sealing member.

16. The display device of claim 10,
wherein an outer surface of the touch antistatic line protrudes outward from an outer surface of the sealing member.

17. A display device, comprising:
a display panel including a first substrate, a second substrate, an active element layer disposed on the first substrate, and a sealing member coupling the first substrate and the second substrate to each other; and
a touch member including a plurality of touch lines, a touch antistatic line, and a sub-touch antistatic line,
wherein the outermost touch line of the plurality of touch lines includes a conductive layer that is substantially transparent to visible light, and at least partially overlaps the sealing member,
wherein the touch antistatic line laterally surrounds the display panel and comprises a first touch antistatic line and a second touch antistatic line,
wherein a first end of the first touch antistatic line is disposed adjacent to a second end of the second touch antistatic line with a disconnection area therebetween, and
wherein a portion the sub-touch antistatic line is disposed in the disconnection area.

18. The display device of claim 17,
wherein each touch line of the plurality of touch lines includes a touch signal line and a touch antistatic line, and
wherein the outermost touch line is the touch antistatic line.

19. The display device of claim 18,
wherein the touch signal line includes a touch driving line and a touch sensing line, and
wherein each of the touch driving line and touch sensing line of the touch signal line is formed from a first conductive layer, and the touch antistatic line is formed from a second conductive layer different from the first conductive layer.

20. The display device of claim 19,
wherein light transmittance of the first conductive layer is lower than light transmittance of the second conductive layer, and the first conductive layer includes a metal that is opaque to visible light.

* * * * *